US012622333B2

(12) United States Patent
Matsubara et al.

(10) Patent No.: US 12,622,333 B2
(45) Date of Patent: May 5, 2026

(54) SEMICONDUCTOR DEVICE

(71) Applicant: ROHM CO., LTD., Kyoto (JP)

(72) Inventors: Hiroaki Matsubara, Kyoto (JP);
Yoshizo Osumi, Kyoto (JP); Tomohira Kikuchi, Kyoto (JP); Shingo Matsumaru, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 423 days.

(21) Appl. No.: 18/249,005

(22) PCT Filed: Oct. 1, 2021

(86) PCT No.: PCT/JP2021/036403
§ 371 (c)(1),
(2) Date: Apr. 13, 2023

(87) PCT Pub. No.: WO2022/085394
PCT Pub. Date: Apr. 28, 2022

(65) Prior Publication Data
US 2023/0402354 A1    Dec. 14, 2023

(30) Foreign Application Priority Data

Oct. 20, 2020    (JP) ................................. 2020-175805

(51) Int. Cl.
H01L 23/495        (2006.01)
H01L 23/00        (2006.01)
        (Continued)

(52) U.S. Cl.
CPC .... H01L 23/49575 (2013.01); H01L 23/3121 (2013.01); H01L 24/48 (2013.01);
        (Continued)

(58) Field of Classification Search
None
See application file for complete search history.

(56) References Cited

U.S. PATENT DOCUMENTS

2008/0304305 A1* 12/2008 Chang ..................... H01L 25/16
                                                        363/123
2016/0307854 A1* 10/2016 Matsubara .............. H01L 24/45
2021/0265310 A1*  8/2021 Kikuchi ................. H01L 24/73

FOREIGN PATENT DOCUMENTS

JP        2014-155412        8/2014
JP        2016-201456 A     12/2016
                (Continued)

OTHER PUBLICATIONS

International Search Report issued in International Application No. PCT/JP2021/036403, Dec. 21, 2021, 2 pages.
                (Continued)

*Primary Examiner* — Sue A Purvis
*Assistant Examiner* — Jordan M Klein
(74) *Attorney, Agent, or Firm* — HSML P.C.

(57)        ABSTRACT

A semiconductor device includes a conductive support member with first and second die pads, a first semiconductor element on the first die pad, a second semiconductor element on the second die pad for forming a first output-side circuit, and a sealing resin. The first semiconductor element includes a circuit part forming an input-side circuit, and an insulating part that transmits a signal between the input-side and the first output-side circuits, while providing electrical insulation between the input-side and the first output-side circuits. The sealing resin includes first and second side faces spaced apart in an x direction and a third side face perpendicular to a y direction. The conductive support member includes input-side terminals protruding from the first side face and first output-side terminals protruding from the second side face. The conductive support member is not exposed on the third side face.

17 Claims, 13 Drawing Sheets

(51) Int. Cl.
H01L 23/31 (2006.01)
H01L 25/18 (2023.01)

(52) U.S. Cl.
CPC ........ H01L 25/18 (2013.01); *H01L 23/49555*
*(2013.01); H01L 2224/48091 (2013.01); H01L*
*2224/48137 (2013.01); H01L 2224/48247*
*(2013.01); H01L 2224/48456 (2013.01); H01L*
*2224/4846 (2013.01)*

(56) References Cited

FOREIGN PATENT DOCUMENTS

| | | | |
|----|----------------|-----|--------|
| JP | 2017-174885 | A | 9/2017 |
| JP | 2018-121035 | A | 8/2018 |
| WO | 2012/111254 | A1 | 8/2012 |
| WO | 2020/012957 | | 1/2020 |

OTHER PUBLICATIONS

Office Action issued in corresponding Japanese Patent application No. 2022-557358, Jun. 10, 2025, and machine translation (10 pages).

* cited by examiner

A10

A10

A10

7

71

73 { 731 733 732

76 { 761 763 762 }

51d

51

73 732 733 731

51c

72

51b

75 { 751 753 752 }

51a y2
z1 — z2
y1

SEMICONDUCTOR DEVICE

TECHNICAL FIELD

The present disclosure relates to a semiconductor device provided in a single package in which signals are transmitted between a plurality of semiconductor elements via an insulating or isolating part.

BACKGROUND ART

Inverter devices have been conventionally used in home appliances and electronic vehicles (including hybrid vehicles, and the same applies hereinafter). For example, an inverter device incorporated in an electronic vehicle includes a plurality of power semiconductors, such as insulated gate bipolar transistors (IGBTs) and metal-oxide-semiconductor field-effect transistors (MOSFETs), and another semiconductor device (including a control element and a drive element). For operation of the inverter device, a control signal from an engine control unit (ECU) is inputted to the control element of the semiconductor device. The control element converts the control signal to a pulse width modulation (PWM) signal and passes the resulting signal to the drive element. Based on the PWM control signal, the drive element controls the switching of the plurality of (e.g., six) power semiconductors at appropriate timing. With the six power semiconductors switched on and off at appropriate timing, DC power supplied from a vehicle-mounted battery is converted into a three-phase AC power suitable for driving the motor. Patent document 1 discloses a semiconductor device (a drive circuit) for use in a motor drive device.

In one example, the control element and the drive element described above are included in a single package. In some cases, the source voltages required for the control element and the drive element are different. In this regard, it is desirable to have increased voltage insulation between the conduction path to the control element and the conduction path to the drive element.

PRIOR ART DOCUMENT

Patent Document

Patent Document 1: JP-A-2014-155412

SUMMARY OF INVENTION

Problem to be Solved by the Invention

In view of the circumstances described above, the present disclosure may aim to provide a semiconductor device suitable for increasing voltage insulation.

Means to Solve the Problem

In accordance with the present disclosure, there is provided a semiconductor device including a conductive support member, a first semiconductor element, a second semiconductor element and a sealing resin. The conductive support member includes a first die pad and a second die pad spaced apart from the first die pad in a first sense of a first direction perpendicular to a thickness direction and held at a potential different from that of the first die pad. The first semiconductor element is mounted on the first die pad. The second semiconductor element is mounted on the second die pad to form an output-side circuit together with the second die pad. The sealing resin covers at least a portion of the conductive support member, the first semiconductor element and the second semiconductor element. The first semiconductor element includes: a circuit part forming an input-side circuit together with the first die pad; and an insulating part that transmits a signal between the input-side circuit and the output-side circuit, while providing electrical insulation between the input-side circuit and the output-side circuit. The conductive support member includes: a plurality of input-side terminals spaced apart from each other in the first direction, where at least one of the plurality of input-side terminals is electrically connected to the input-side circuit; and a plurality of output-side terminals spaced apart from each other in the first direction, where at least one of the plurality of output-side terminals is electrically connected to the output-side circuit. The sealing resin includes: a first side face offset in a first sense of a second direction perpendicular to the thickness direction and the first direction, where the plurality of input-side terminals protrude from the first side face; a second side face offset in a second sense of the second direction, where the plurality of output-side terminals protrude from the second side face; a third side face offset in the first sense of the first direction and connected to the first side face and the second side face; and a fourth side face offset in a second sense of the first direction and connected to the first side face and the second side face. The conductive support member is not exposed on the third side face.

Advantages of Invention

According to the configuration described above, the first semiconductor element includes the insulating part that transmits a signal between the input-side circuit and the output-side circuit and that provides electrical insulation between the input-side circuit and the output-side circuit. This serves to increase the voltage insulation between the input-side circuit and the output-side circuit. According to the configuration described above, in addition, the conductive support member is not exposed on the third side face of the sealing resin. This serves to increase the insulation distance (creepage distance) between the plurality of input-side terminals and the plurality of output-side terminals. This serves to further increase the voltage insulation.

Other features and advergames of the present disclosure will be more apparent through the detailed description given below with reference to the accompanying drawings.

MODE FOR CARRYING OUT THE INVENTION

Figure 1:
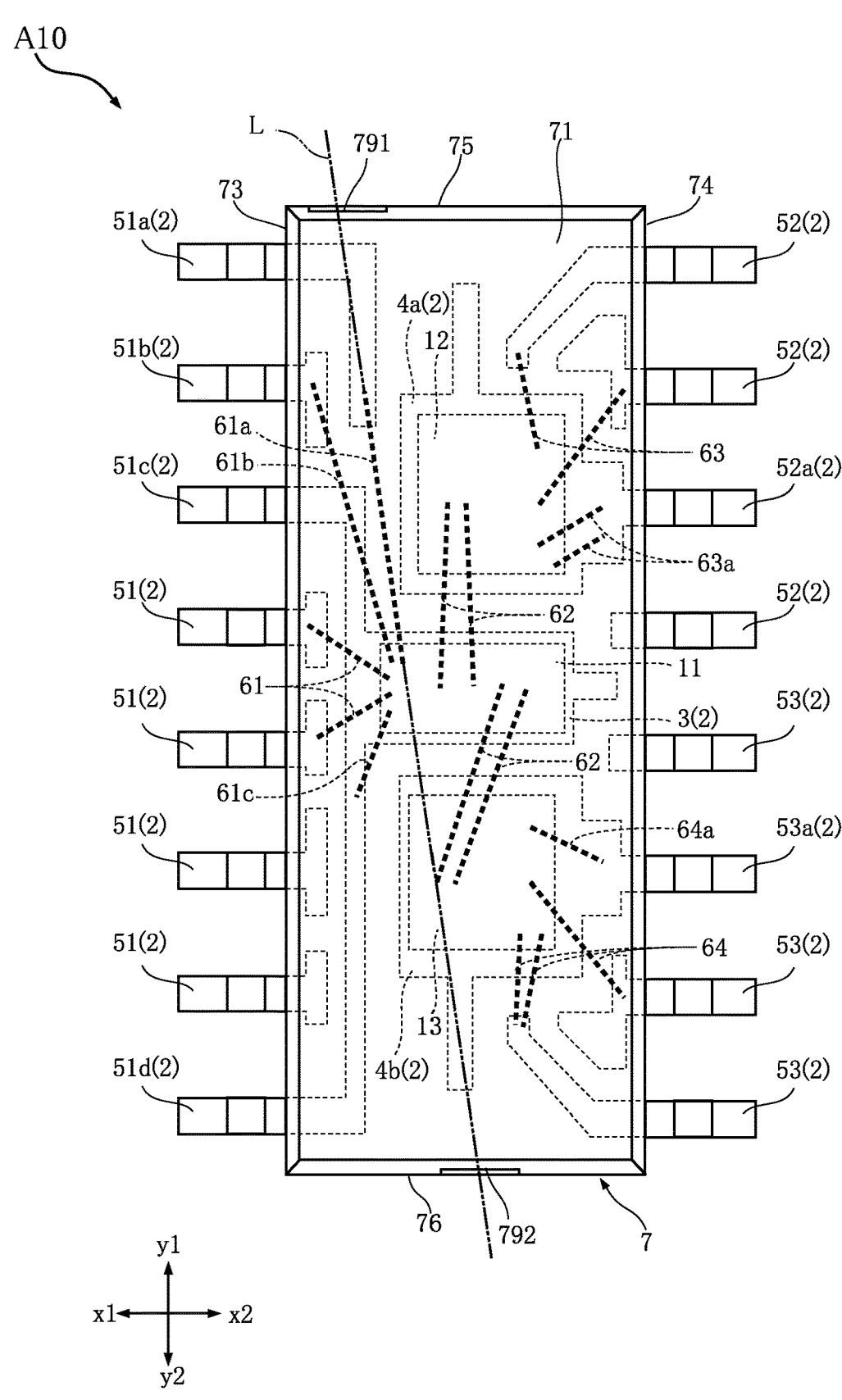
FIG. 1 is a plan view of a semiconductor device according to a first embodiment of the present disclosure.

Preferred embodiments of the present disclosure will be described below with reference to the accompanying drawings.

Unless otherwise noted, the phrases such as "an object A is formed in an object B" and "an object A is formed on an object B" used in the present disclosure include "the object A is formed in direct contact with the object B" and "the object A is formed on the object B with another object interposed between the object A and the object B". Similarly, unless otherwise noted, the phrases such as "an object A is arranged in an object B" and "an object A is arranged on an object B" include "the object A is arranged with direct contact with the object B" and "the object A is arranged on the object B with another object interposed between the object A and the object B". Similarly, unless otherwise noted, the phrase reading "an object A is located on an object B" include "the object A is located in direct contact with the object B" and "the object A is located on the object B with another object interposed between the object A and the object B". Additionally, unless otherwise noted, the phrase "an object A overlaps with an object B as viewed in a certain direction" includes "the object A overlaps with the entire object B as viewed in the direction" and "the object A overlaps with a portion of the object B as viewed in the direction".

FIGS. 1 to 10 show an example of a semiconductor device according to a first embodiment. The semiconductor device A10 is a packaged product that includes a first semiconductor element 11, a second semiconductor element 12, a third semiconductor element 13, a conductive support member 2, a plurality of wires 61, 62, 63 and 64 and a sealing resin 7. The conductive support member 2 includes a first die pad 3, a second die pad 4a, a third die pad 4b, a plurality of input-side terminals 51, a plurality of first output-side terminals 52 and a plurality of second output-side terminals 53. The semiconductor device A10 may be configured for surface mounting on a wiring board of an electric vehicle inverter but the present disclosure is not limited to such. That is, the semiconductor device A10 may have other uses and/or other functions. The semiconductor device A10 is contained in a small outline package (SOP) but other packaging types may be usable.

Figure 2:
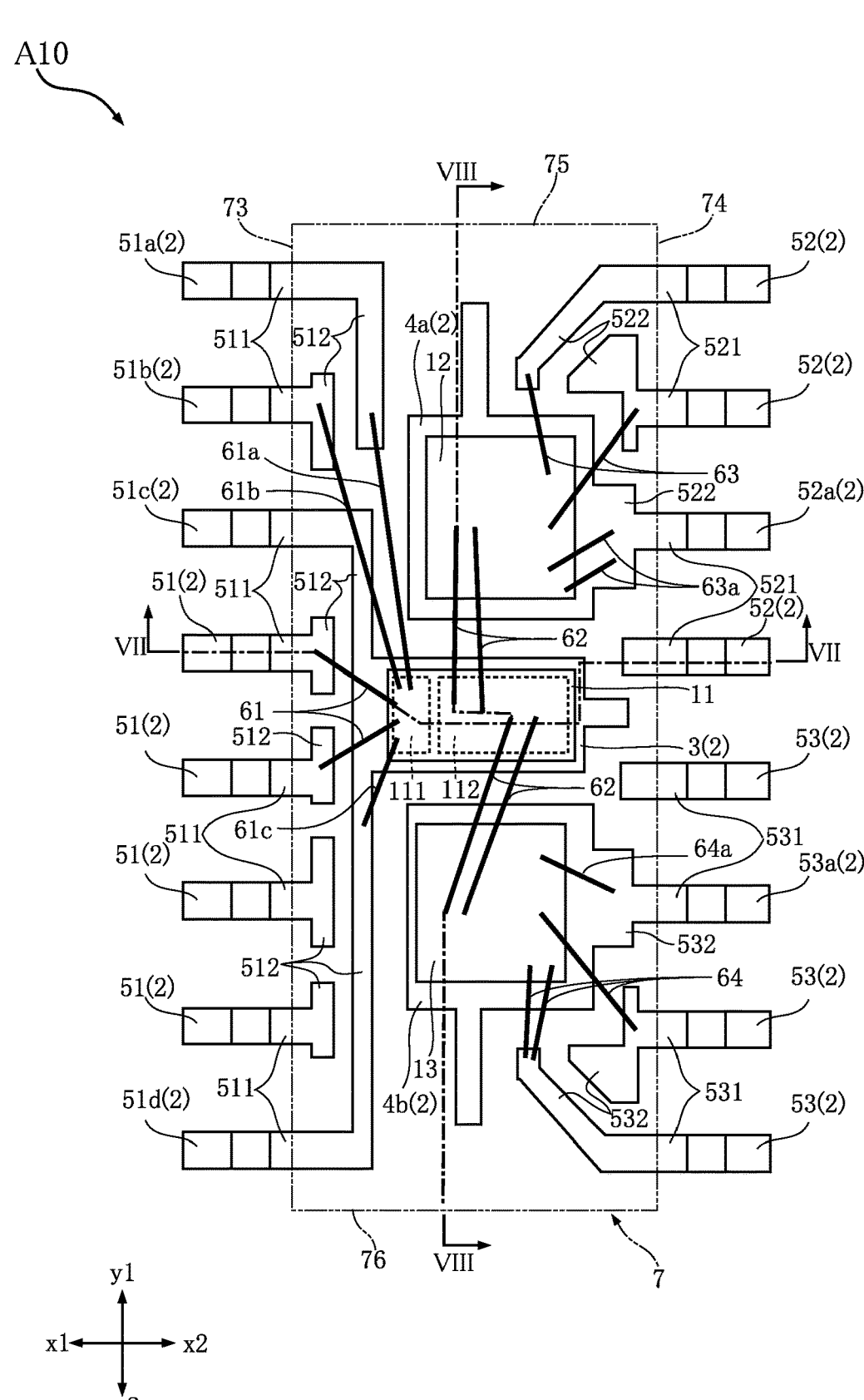
FIG. 2 is a semiconductor device of the semiconductor device shown in FIG. 1, with the sealing resin shown transparent.
Figure 3:
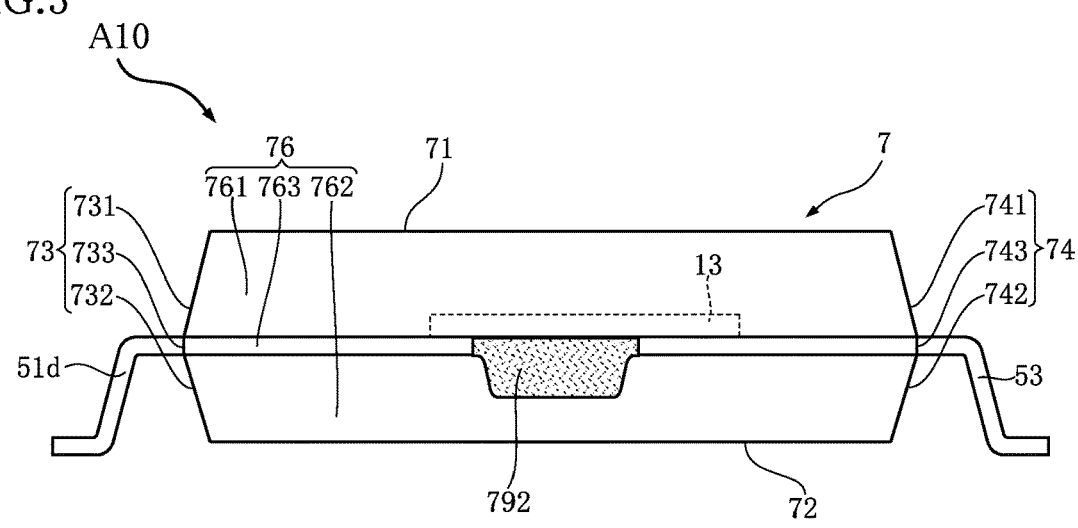
FIG. 3 is a front view of the semiconductor device shown in FIG. 1.
Figure 3:
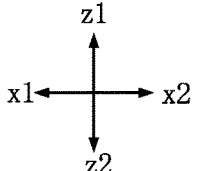
Figure 4:
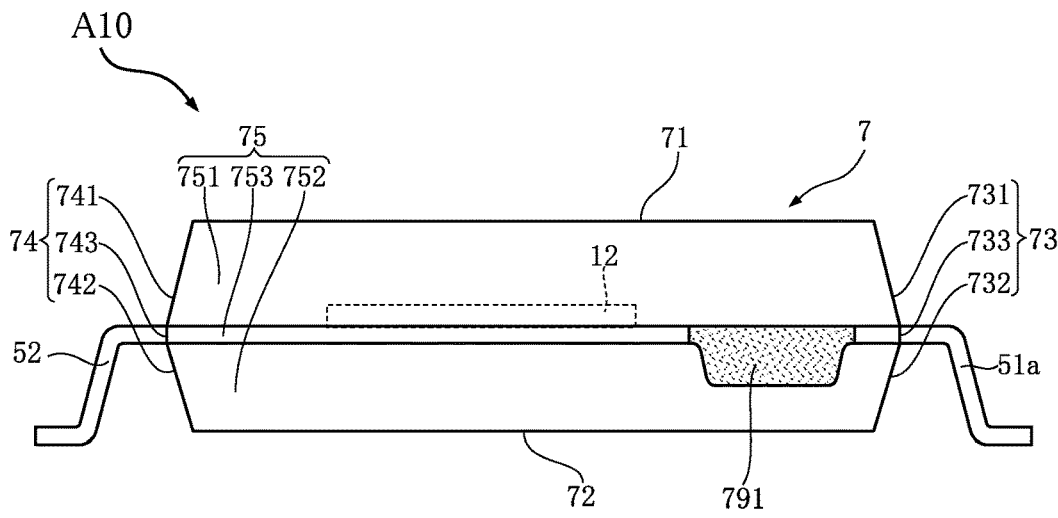
FIG. 4 is a rear view of the semiconductor device shown in FIG. 1.
Figure 4:
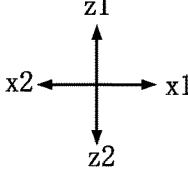
Figure 5:
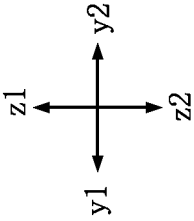
FIG. 5 is a left-side view of the semiconductor device shown in FIG. 1.
Figure 6:
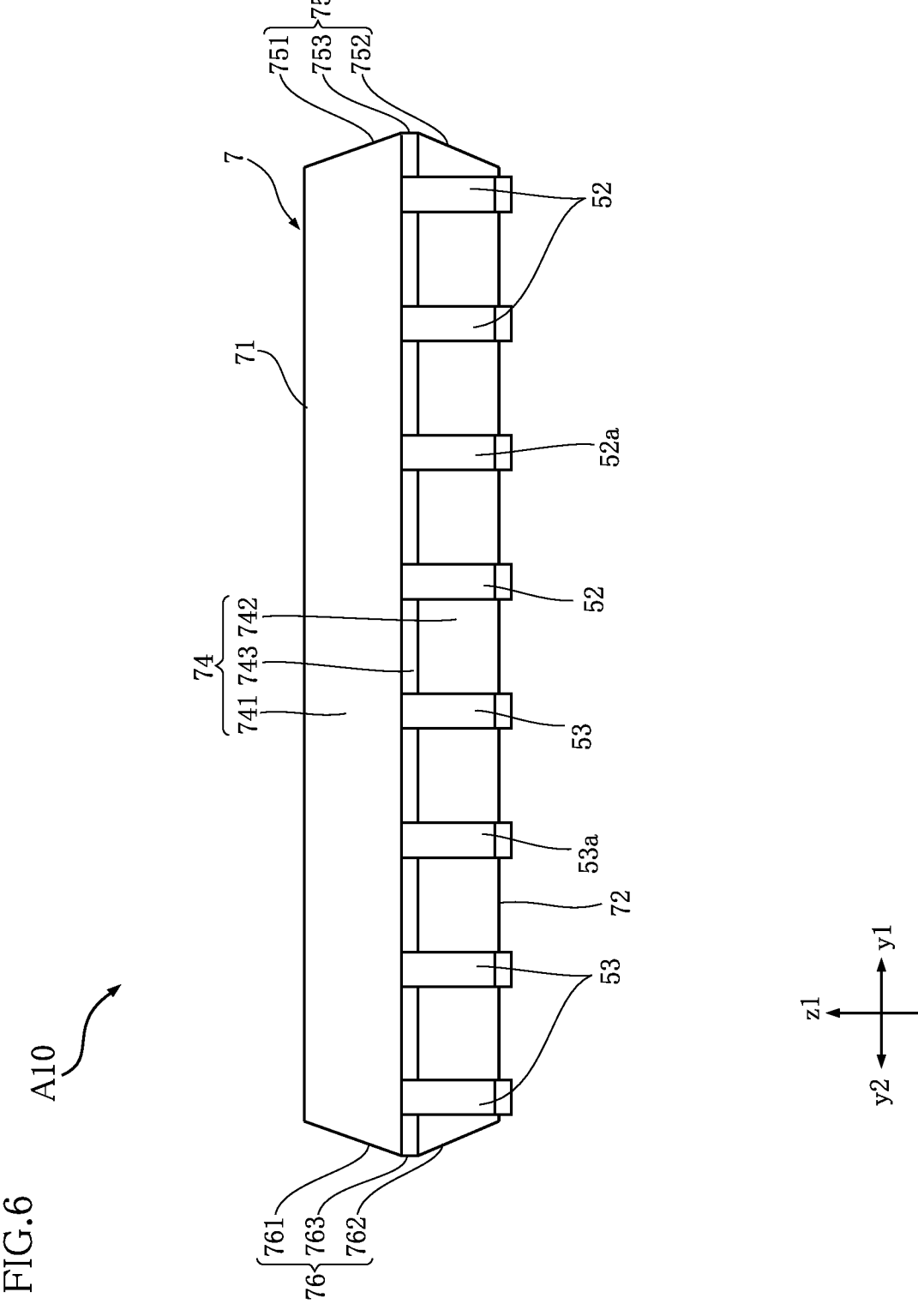
FIG. 6 is a right-side view of the semiconductor device shown in FIG. 1.
Figure 7:
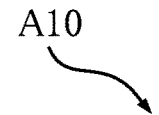
FIG. 7 is a sectional view taken along line VII-VII of FIG. 2.
Figure 7:
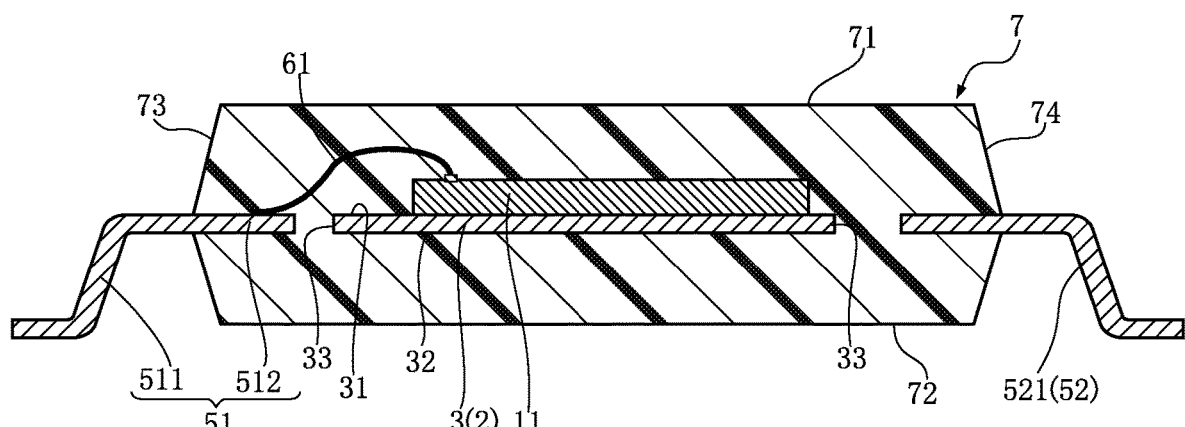
Figure 7:
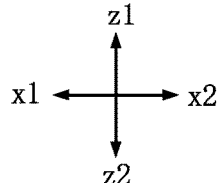
Figure 8:
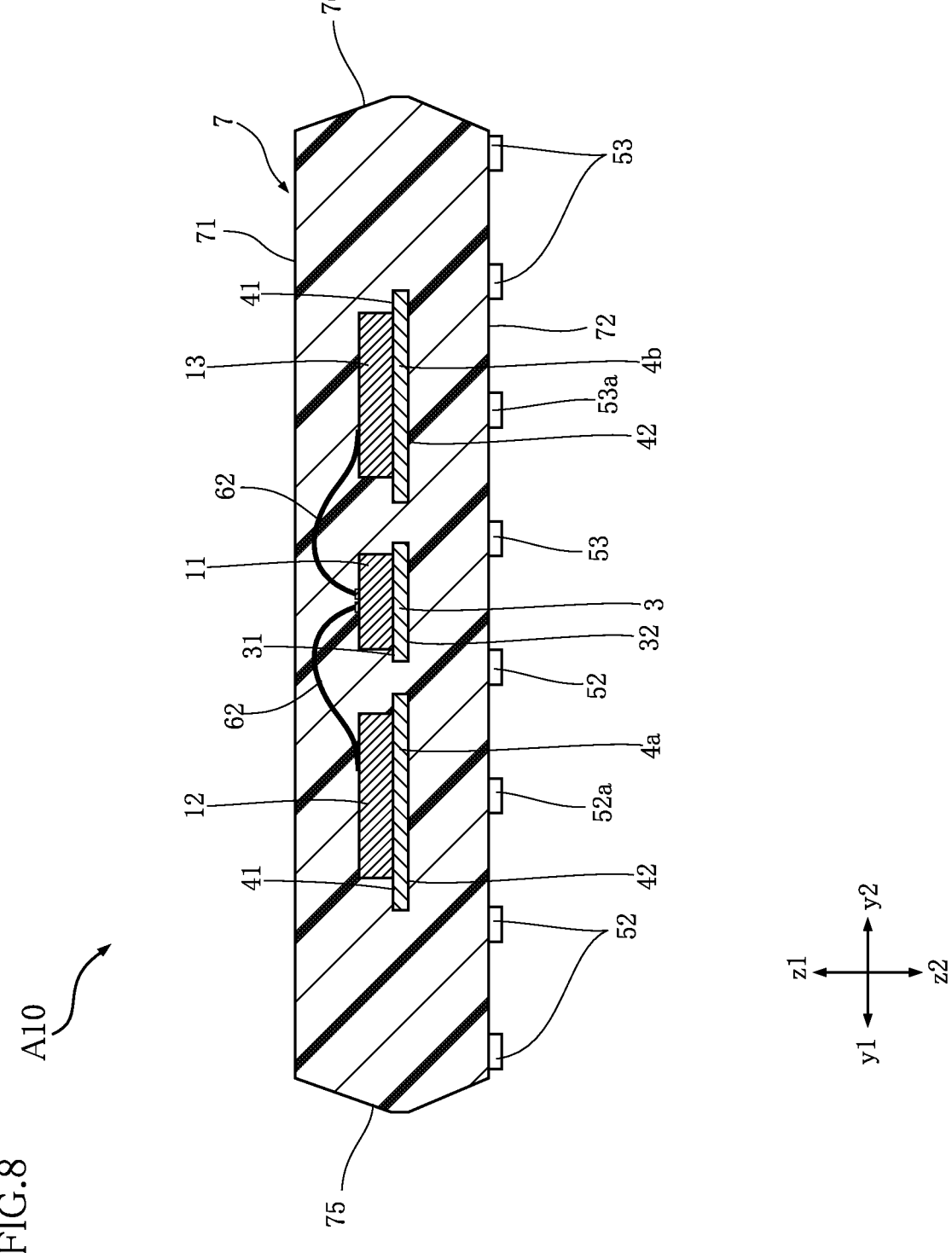
FIG. 8 is a sectional view taken along line VIII-VIII of FIG. 2.
Figure 9:
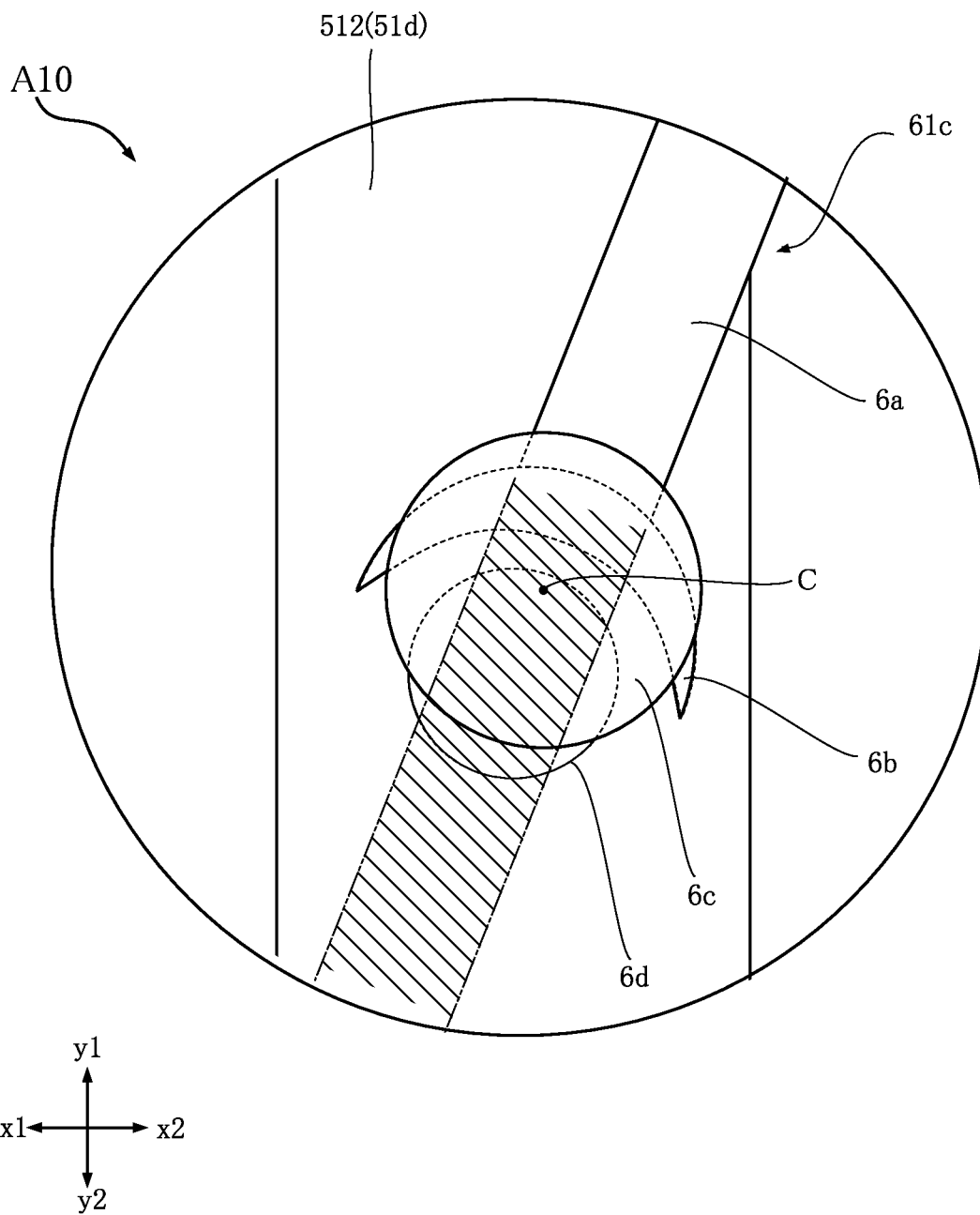
FIG. 9 is an enlarged view of a portion of FIG. 2.
Figure 10:
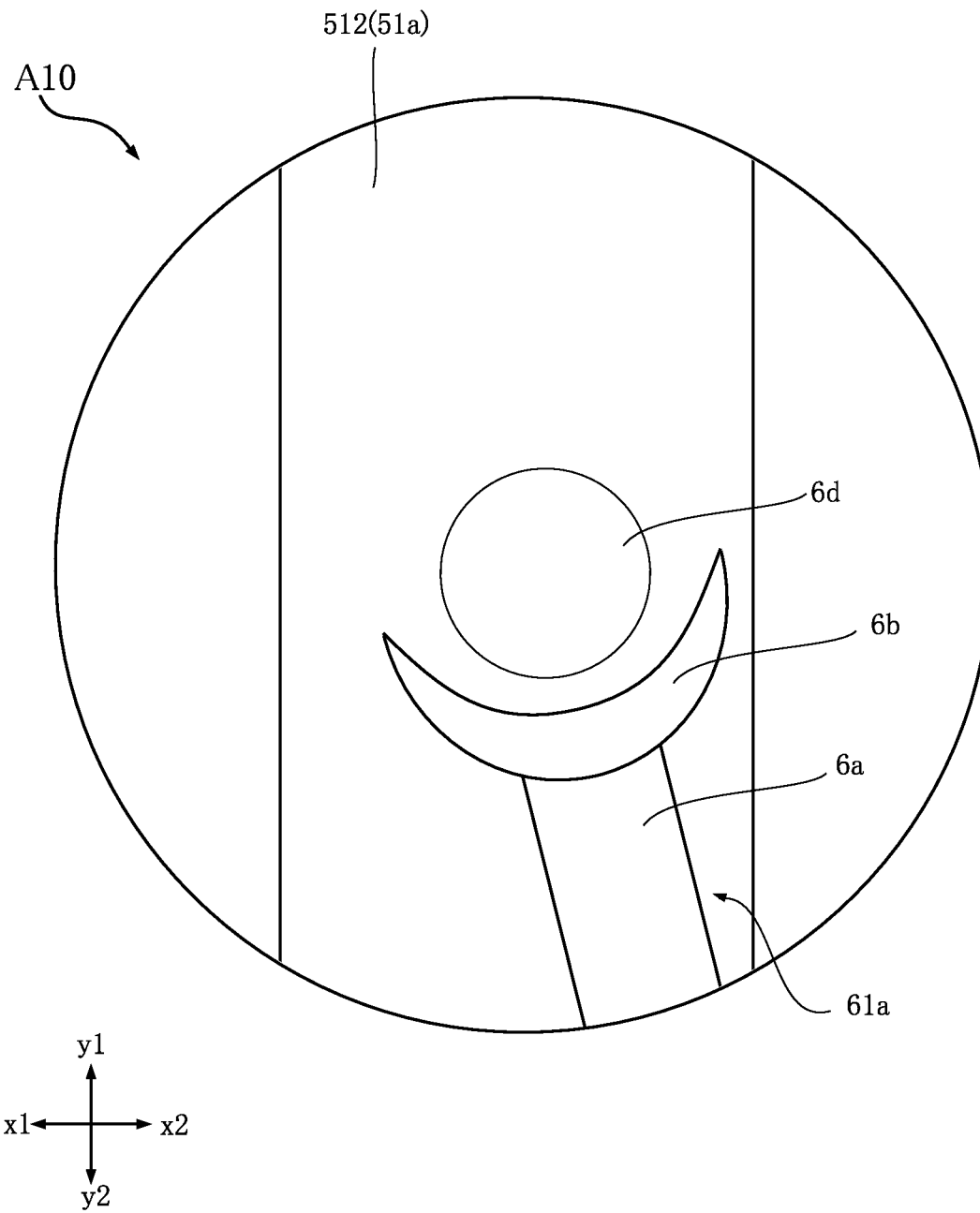
FIG. 10 is an enlarged view of a portion of FIG. 2.

FIG. 1 is a plan view of the semiconductor device A10. FIG. 2 is a plan view of the semiconductor device A10 with the outline of the sealing resin 7 is shown in phantom line (two-dot-dash line). FIG. 3 is a front view of the semiconductor device A10. FIG. 4 is a rear view of the semiconductor device A10. FIG. 5 is a left-side view of the semiconductor device A10. FIG. 6 is a right-side view of the semiconductor device A10. FIG. 7 is a sectional view taken along line VII-VII of FIG. 2. FIG. 8 is a sectional view taken along line VIII-VIII of FIG. 2. FIG. 9 is an enlarged view of FIG. 2 (showing a portion around a second bond 6b of a wire 61c, which will be described later). FIG. 10 is an enlarged view of FIG. 2 (showing a portion around a second bond 6b of a wire 61a, which will be described later).

The semiconductor device A10 has a rectangular shape as viewed in the thickness direction (in plan view). For convenience, the thickness direction of the semiconductor device A10 is designated as the z direction. The direction perpendicular to the z direction and parallel to the shorter sides of the semiconductor device A10 is designated as the x direction. The direction perpendicular to the z and x directions is designated as the y direction. In addition, the side in a first sense of the z direction is designated as z1 side, whereas the side in a second sense of the z direction is designated as z2 side. Similar definitions are made regarding the x and y directions. The x and y directions may be respectively referred to as the "first direction" and "second direction" (or vice versa). The shapes and dimensions of the semiconductor device A10 are not specifically limited.

The first semiconductor element 11, the second semiconductor element 12 and the third semiconductor element 13 are essential to the functionality of the semiconductor device A10.

As shown in FIG. 2, the first semiconductor element 11 is mounted on a portion of the conductive support member 2 (on a first die pad 3, which will be described later) and located at the center of the semiconductor device A10 in the x direction and the y direction. The first semiconductor element 11 has a rectangular shape that is longer in the x direction as viewed in the z direction. The first semiconductor element 11 includes a substrate (not illustrated) made of Si and also includes a circuit part 111 and an insulating part 112 formed on the substrate as shown in FIG. 2.

The circuit part 111 is offset within the first semiconductor element 11 toward the x1 side in the x direction and includes a circuit for converting a control signal inputted from an ECU into a PWM control signal and a transmission circuit for transmitting the PWM control signal to the second semiconductor element 12 and the third semiconductor element 13. In this embodiment, the circuit part 111 receives control signals for high-side and low-side and transmits a high-side PWM control signal to the second semiconductor element 12 and a low-side PWM control signal to the second semiconductor element 12.

The insulating part 112 is offset within the first semiconductor element 11 toward the x2 side in the x direction and implements transmission of PWM control signals in an insulated condition. The insulating part 112 is electrically connected to the circuit part 111 in the first semiconductor element 11 to receive PWM control signals from the transmission circuit of the circuit part 111, and implements insulated transmission of the PWM control signals to the second semiconductor element 12 and the third semiconductor element 13. Specifically, the insulating part 112 transmits signals between the circuit part 111 and the second and third semiconductor elements 12 and 13, while also providing electrical insulation between the circuit part 111 and the second/third semiconductor elements 12, 13. In one example, the insulating part 112 is of an inductive type. The insulating part 112 of this embodiment may be an insulation (or isolation) transformer that is fabricated by inductively coupling a plurality of inductors (coils) of e.g. Cu formed on the substrate, thereby to implement insulated transmission of electric signals. The plurality of inductors include a transmitting-side inductor and a receiving-side inductor stacked with each other in the thickness direction (the z direction) of the first semiconductor element 11. A dielectric layer made of e.g. $SiO_2$ is interposed between the transmitting-side inductor and the receiving-side inductor. This dielectric layer electrically insulates the transmitting-side inductor and the receiving-side inductor. Although the insulating part 112 of this embodiment is of an inductive type, the insulating part 112 may be of a capacitive type. A capacitor is one example of a capacitive-type insulator.

The first semiconductor element 11 transmits PWM control signals transmitted from the circuit part 111 to the second semiconductor element 12 and the third semiconductor element 13 via the insulating part 112.

Each of the second semiconductor element 12 and the third semiconductor element 13 includes a circuit for receiving a PWM control signal and a circuit (gate driver) for switching a switching element (such as IGBT or MOSFET) based on the received PWM control signal. As shown in FIG. 2, the second semiconductor element 12 is mounted on a portion of the conductive support member 2 (on a second die pad 4a, which will be described later) and located on the y1 side in the y direction relative to the first semiconductor element 11. The second semiconductor element 12 drives a high-side switching element. As shown in FIG. 2, the third semiconductor element 13 is mounted on a portion of the conductive support member 2 (on a third die pad 4b, which will be described later) and located on the y2 side in the y direction relative to the first semiconductor element 11. The third semiconductor element 13 drives a low-side switching element.

The first semiconductor element 11 may transmit signals other than the PWM control signals to the second semiconductor element 12 and the third semiconductor element 13. For example, the second semiconductor element 12 and the third semiconductor element 13 may transmit signals to the first semiconductor element 11, such as sensor signals detected by a temperature sensor disposed near the motor.

Generally, a motor driver circuit used in an inverter device for an electric vehicle is a half-bridge circuit composed of a low-side switching element and a high-side switching element connected by totem-pole configuration. In an insulated gate driver, only one of the low-side switching element and the high-side switching element is turned ON at an any given time. In the high-voltage region, the source of the low-side switching element and the reference voltage of the insulated gate driver for driving the low-side switching element are connected to ground, so that the setting of the gate-to-source voltage is relative to the ground. On the other hand, the source of the high-side switching element and the reference voltage of the insulated gate driver for driving the high-side switching element are connected to the output node of the half-bridge circuit. The potential at the output node of the half-bridge circuit changes depending on which of the low-side switching element and the high-side switching element is ON, so that the reference potential of the high-side insulated gate driver changes as well. When the high-side switching element is ON, the reference potential becomes equal to the voltage applied to the drain of the high-side switching element (for example, 600 V or higher). In the semiconductor device A10, the second semiconductor element 12 is used as an insulated gate driver for driving a high-side switching element. The second semiconductor element 12 and the circuit part 111 of the first semiconductor element 11 are connected to different grounds for ensuring insulation, and the second semiconductor element 12 may be subjected to transient voltage of 600 V or higher relative to the ground of the circuit part 111. In light of such a large potential difference occurring between the circuit part 111 of the first semiconductor element 11 and the second semiconductor element 12, the first semiconductor element 11 of the semiconductor device A10 includes the insulating part 112 configured to electrically isolate the input-side circuit including the circuit part 111 of the first semiconductor element 11 and the first output-side circuit including the second semiconductor element 12 from each other. That is, the insulating part 112 of the first semiconductor element 11 provides electrical insulation between the input-side circuit held at lower potential and the first output-side circuit held at higher potential. In addition, the third semiconductor element 13 of the semiconductor device A10 may also be used as an insulated gate driver for driving a high-side switching element. The insulating part 112 of the first semiconductor element 11 can also provide electric insulation between the input-side circuit that includes the circuit part 111 of the first semiconductor element 11 and the second output-side circuit that includes the third semiconductor element 13.

The first semiconductor element 11 is provided with a plurality of electrodes on the upper surface (the surface on the z1 side). These electrodes are electrically connected to the circuit formed in the first semiconductor element 11. Similarly, the second semiconductor element 12 is provided with a plurality of electrodes on the upper surface (the surface on the z1 side). These electrodes are electrically connected to the circuit formed in the second semiconductor element 12. The third semiconductor element 13 is provided with a plurality of electrodes on the upper surface (the surface on the z1 side). These electrodes are electrically connected to the circuit formed in the third semiconductor element 13.

The conductive support member 2 forms the conduction path connecting the first semiconductor element 11, the second semiconductor element 12 and the third semiconductor element 13 of the semiconductor device A10 to the wiring board of an inverter device. The conductive support member 2 may be made of an alloy composition containing Cu, for example. The conductive support member 2 is formed from a leadframe 81, which will be described later. The first semiconductor element 11, the second semiconductor element 12 and the third semiconductor element 13 are mounted on the conductive support member 2. As shown in FIG. 2 the conductive support member 2 includes a first die pad 3, a second die pad 4a, a third die pad 4b, a plurality of input-side terminals 51, a first output-side terminal 52 and a plurality of second output-side terminals 53.

The first die pad 3 is located at the center of the semiconductor device A10 in the x direction and the y direction. The second die pad 4a is spaced apart from the first die pad 3 toward y1 side in the y direction. The third die pad 4b is spaced apart from the first die pad 3 toward y2 side in the y direction.

As shown in FIGS. 2, 7 and 8, the first semiconductor element 11 is mounted on the first die pad 3. The first die pad 3, which is electrically connected to the first semiconductor element 11, is a component of the input-side circuit described above. The first die pad 3 may be substantially rectangular as viewed in the z direction, for example. The first die pad 3 has a first obverse surface 31 and a first reverse surface 32. As shown in FIGS. 7 and 8, the first obverse surface 31 and the first reverse surface 32 are spaced apart in the z direction. The first obverse surface 31 is located on the z1 side and the first reverse surface 32 is located on the z2 side. The first obverse surface 31 and the first reverse surface 32 are substantially flat. The first semiconductor element 11 is bonded to the first obverse surface 31 with an electrically conductive bonding material (such as solder, metal paste or sintered metal) not shown in the figures.

As shown in FIGS. 2 and 8, the second semiconductor element 12 is mounted on the second die pad 4a. The second die pad 4a, which is electrically connected to the second semiconductor element 12, is a component of the first output-side circuit described above. The second die pad 4 may be substantially rectangular as viewed in the z direction, for example. As shown in FIGS. 2 and 8, the third semiconductor element 13 is mounted on the third die pad 4b. The third die pad 4b, which is electrically connected to the third semiconductor element 13, is a component of the second output-side circuit described above. The third die pad 4b may be substantially rectangular as viewed in the z direction, for example. The second die pad 4a and the third die pad 4b each have a second obverse surface 41 and a second reverse surface 42. As shown in FIG. 8, the second obverse surface 41 and the second reverse surface 42 are spaced apart in the z direction. The second obverse surface 41 is located on the z1 side and the second reverse surface 42 is located on the z2 side. The second obverse surface 41 and the second reverse surface 42 are substantially flat. The second semiconductor element 12 is bonded to the second obverse surface 41 of the second die pad 4a with an electrically conductive bonding material not shown in the figures. The third semiconductor element 13 is bonded to the second obverse surface 41 of the third die pad 4b with an electrically conductive bonding material not shown in the figures.

The input-side terminals 51 form conduction paths connecting the semiconductor device A10 to the wiring board of an inverter device when they bonded to the wiring board. The input-side terminals 51, which are electrically connected to the first semiconductor element 11 as necessary, are components of the input-side circuit described above. As shown in FIGS. 1, 2 and 5, the input-side terminals 51 are spaced apart from each other in the y direction. The input-side terminals 51 are located on the x1 side in the x direction relative to the first die pad 3 and protrude from the sealing resin 7 (from the first side face 73 described later) toward the x1 side in the x direction. The input-side terminals 51 include a power input-side terminal for receiving voltage supply, a ground terminal, input-side terminals for receiving two different signals, an input-side terminal for receiving a disable signal and a dummy terminal. The semiconductor device A10 of this embodiment includes, but not limited to, eight input-side terminals 51. Each input-side terminal 51 includes a lead segment 511 and a pad segment 512.

The lead segment 511 has a rectangular shape elongated in the x direction. The lead segment 511 has a portion exposed from the sealing resin 7 and a portion covered with the sealing resin 7. As shown in FIG. 7, the portion of the lead segment 511 exposed from the sealing resin 7 is bent in a gull-wing profile. The portion of the lead segment 511 exposed from the sealing resin 7 may be subjected to a plating process. With the plating process, a layer made of, for example, an alloy containing Sn such as solder is formed to coat the portion exposed from the sealing resin 7. The plating layer improves the adhesion of solder to the exposed portion and prevents erosion of the exposed portion associated with soldering when the semiconductor device A10 is bonded by soldering to the wiring board of an inverter device.

The pad segment 512 is connected to the lead segment 511 and has a rectangular shape wider than the lead segment 511 in the y direction. The upper surface (the surface on the z1 side) of the pad segment 512 may be subjected to a plating process. With the plating process, a layer made of, for example, metal containing Ag is formed to coat the upper surface of the pad segment 512. The plating layer serves to increase the bonding strength of the later described wires 61 and also to protect the leadframe 81 (described later) from mechanical shock expected at the time of bonding the wires 61, as will be described later. The entire portion of the pad segment 512 is covered with the sealing resin 7. The pad segment 512 is substantially flat.

The input-side terminals 51 include input-side terminals 51a, 51b, 51c and 51d. As shown in FIG. 2, the input-side terminal 51a is the outermost one toward the y1 side in the y direction. The input-side terminal 51a is an example of an "input-side first terminal". The input-side terminal 51b is adjacent to the input-side terminal 51a as shown in FIG. 2. The input-side terminal 51b is an example of an "input-side second terminal". The input-side terminal 51c is adjacent to the input-side terminal 51b as shown in FIG. 2. The input-side terminal 51c is connected by the pad segment 512 to the end of the first die pad 3 on the x1 side in the x direction from the y1 side in the y direction. The input-side terminal 51d is the outermost one toward the y2 side in the y direction as shown in FIG. 2. The input-side terminal 51d is connected by the pad segment 512 to the end of the first die pad 3 on the x1 side in the x direction from the y2 side in the y direction. The input-side terminals 51c and 51d thus support the first die pad 3. The input-side terminal 51d is an example of a "supporting terminal", and the input-side terminal 51c is an example of a "second supporting terminal". The input-side terminals 51 other than the input-side terminals 51c and 51d are not connected to any of the first die pad 3, the second die pad 4a and the third die pad 4b and examples of a "discrete terminal". The input-side terminals 51 are not limited to specific shapes.

As with the input-side terminals 51, the first output-side terminals 52 form conduction paths connecting the semiconductor device A10 to the wiring board of an inverter device when they are bonded to the wiring board. The first output-side terminals 52, which are electrically connected to the second semiconductor element 12 as necessary, are components of the first output-side circuit described above. As shown in FIGS. 1, 2 and 6, the first output-side terminals 52 are spaced apart from each other in the y direction. The first output-side terminals 52 are located on the x2 side in the x direction relative to the second die pad 4a and protrude from the sealing resin 7 (from the second side face 74 described later) toward the x2 side in the x direction. The first output-side terminals 52 include a power input-side terminal for receiving voltage supply, a ground terminal, a high-side output-side terminal and a dummy terminal. The semiconductor device A10 of this embodiment includes, but not limited to, four first output-side terminals 52. Each first output-side terminal 52 includes a lead segment 521 and a pad segment 522.

The lead segment 521 has a rectangular shape elongated in the x direction. The lead segment 521 has a portion exposed from the sealing resin 7 and a portion covered with the sealing resin 7. As shown in FIG. 7, the portion of the lead segment 521 exposed from the sealing resin 7 is bent in a gull-wing profile. As with the lead segment 511, the portion of the lead segment 521 exposed from the sealing resin 7 may be plated (e.g., with an alloy containing Sn, such as solder).

The pad segment 522 is connected to the lead segment 521 and is wider than the lead segment 521 in the y direction. The shape of the pad segment 522 as viewed in the z direction is not specifically limited. As with the upper surface of the pad segment 512, the upper surface (the surface on the z1 side) of the pad segment 522 may be plated (e.g., with an alloy containing Ag, such as solder). The entire portion of the pad segment 522 is covered with the sealing resin 7. The pad segment 522 is substantially flat. In this embodiment, the outermost first output-side terminal 52 toward the y2 side is without a pad segment 522.

The first output-side terminals 52 include a first output-side terminal 52a. As shown in FIG. 2, the first output-side terminal 52a is the third one from the y1 side in the y direction. The first output-side terminal 52a is connected by the pad segment 522 to the end of the second die pad 4a on the x2 side in the x direction, thereby supporting the second die pad 4a. The first output-side terminal 52a is an example of a "supporting terminal". The first output-side terminals 52 other than the first output-side terminal 52a are not connected to any of the first die pad 3, the second die pad 4a and the third die pad 4b and examples of a "discrete terminal". The first output-side terminals 52 are not limited to specific shapes.

As with the input-side terminals 51, the second output-side terminals 53 form conduction paths connecting the semiconductor device A10 to the wiring board of an inverter device when they are bonded to the wiring board. The second output-side terminals 53, which are electrically connected to the third semiconductor element 13 as necessary, are components of the second output-side circuit described above. As shown in FIGS. 1, 2 and 6, the second output-side terminals 53 are spaced apart from each other in the y direction. The second output-side terminals 53 are located on the x2 side in the x direction relative to the third die pad 4b and protrude from the sealing resin 7 (from the second side face 74 described later) toward the x2 side in the x direction. Relative to the first output-side terminals 52, the second output-side terminals 53 are located on the y2 side in the y direction. The second output-side terminals 53 include a power input-side terminal for receiving voltage supply, a ground terminal, a low-side output-side terminal and a dummy terminal. The semiconductor device A10 of this embodiment includes, but not limited to, four second output-side terminals 53. Each second output-side terminal 53 includes a lead segment 531 and a pad segment 532.

The lead segment 531 has a rectangular shape elongated in the x direction. The lead segment 531 has a portion exposed from the sealing resin 7 and a portion covered with the sealing resin 7. As shown in FIG. 3, the portion of the lead segment 531 exposed from the sealing resin 7 is bent in a gull-wing profile. As with the lead segment 511, the portion of the lead segment 531 exposed from the sealing resin 7 may be plated (e.g., with an alloy containing Sn, such as solder).

The pad segment 532 is connected to the lead segment 531 and is wider than the lead segment 531 in the y direction. The shape of the pad segment 532 as viewed in the z direction is not specifically limited. As with the upper surface of the pad segment 512, the upper surface (the surface on the z1 side) of the pad segment 532 may plated (e.g., with an alloy containing Ag, such as solder). The entire portion of the pad segment 532 is covered by the sealing resin 7. The pad segment 532 is substantially flat. In this embodiment, the outermost second output-side terminal 53 toward the y1 side is without a pad segment 532.

The second output-side terminals 53 include a second output-side terminal 53a. As shown in FIG. 2, the second output-side terminal 53a is the second one from the y1 side in the y direction. The second output-side terminal 53a is connected by the pad segment 532 to the end of the third die pad 4b on the x2 side in the x direction, thereby supporting the third die pad 4b. The second output-side terminal 53a is an example of a "supporting terminal". The second output-side terminals 53 other than the second output-side terminal 53a are not connected to any of the first die pad 3, the second die pad 4a and the third die pad 4b and examples of a "discrete terminal". The second output-side terminals 53 are not limited to specific shapes.

In the semiconductor device A10, a transient voltage of 600 V or higher relative to the ground of the circuit part 111 of the first semiconductor element 11 may be applied to the second semiconductor element 12 or the third semiconductor element 13. This may result in a significant potential difference occurring between the first output-side terminals 52, which are electrically connected to the second semiconductor element 12, or the second output-side terminals 53, which are electrically connected to the third semiconductor element 13, and the input-side terminals 51, which are electrically connected to the circuit part 111 of the first semiconductor element 11.

As shown in FIG. 2, the wires 61, 62, 63 and 64 form conduction paths together with the conductive support member 2. The conduction paths are for the first semiconductor element 11, the second semiconductor element 12 and the third semiconductor element 13 to perform predetermined functions. Each of the wires 61, 62, 63 and 64 may be made of a metal containing Au, Cu or Al.

The wires 61 form conduction paths connecting the circuit part 111 of the first semiconductor element 11 to the input-side terminals 51 as shown in FIG. 2. The wires 61 electrically connect the circuit part 111 of the first semiconductor element 11 to at least one of the input-side terminals 51. The wires 61 are components of the input-side circuit described above. As shown in FIG. 2, each wire 61 is bonded to one electrode of the circuit part 111 of the first semiconductor element 11 and to the pad segment 512 of one input-side terminal 51. The wires 61 include wires 61a, 61b and 61c.

The wire 61a is bonded to one electrode of the circuit part 111 of the first semiconductor element 11 and to the pad segment 512 of the input-side terminal 51a. Consequently, the wire 61a is relatively long and extends through a region near the second semiconductor element 12 as viewed in the z direction. The wire 61b is bonded to one electrode of the circuit part 111 of the first semiconductor element 11 and also to the pad segment 512 of the input-side terminal 51b. Thus, the wire 61b is also relatively long. In addition, the wire 61a extends between the second semiconductor element 12 and the wire 61b as viewed in the z direction. The wire 61a is an example of a "first wire", and the wire 61b is an example of a "second wire".

The wire 61c is bonded to one electrode of the circuit part 111 of the first semiconductor element 11 and also to the pad segment 512 of the input-side terminal 51d. Since the pad segment 512 of the input-side terminal 51d is connected to the first die pad 3, the input-side terminal 51d supports the first die pad 3. The wire 61c is an example of a "supporting-terminal wire". The wires 61 other than the wire 61c are examples of a "discrete-terminal wire".

Each wire 62 forms a conduction path connecting the insulating part 112 of the first semiconductor element 11 to the second semiconductor element 12 or to the third semiconductor element 13 as shown in FIGS. 2 and 8. The wires 62 electrically connect the insulating part 112 of the first semiconductor element 11 to the second semiconductor element 12 and also to the third semiconductor element 13.

Each wire 62 connected to the second semiconductor element 12 is a component of the first output-side circuit described above, and each wire 62 connected to the third semiconductor element 13 is a component of the second output-side circuit described above. As shown in FIG. 2, each wire 62 is bonded to one electrode of the insulating part 112 of the first semiconductor element 11 and also to one electrode of the second semiconductor element 12 or of the third semiconductor element 13.

The wires 63 form conduction paths connecting the second semiconductor element 12 to the first output-side terminals 52 as shown in FIG. 2. The wires 63 electrically connect the second semiconductor element 12 to at least one of the first output-side terminals 52. The wires 63 are components of the first output-side circuit described above. As shown in FIG. 2, each wire 63 is bonded to one electrode of the second semiconductor element 12 and to the pad segment 522 of one first output-side terminal 52. The wires 63 include a wires 63a.

The wire 63a is bonded to one electrode of the second semiconductor element 12 and also to the pad segment 522 of the first output-side terminal 52a. Since the pad segment 522 of the first output-side terminal 52a is connected to the second die pad 4a, the first output-side terminal 52a supports the second die pad 4a. The wire 63c is an example of a "supporting-terminal wire". The wires 63 other than the wire 63a are examples of a "discrete-terminal wire".

The wires 64 form conduction paths connecting the third semiconductor element 13 to the second output-side terminals 53 as shown in FIG. 2. The wires 64 electrically connect the third semiconductor element 13 to at least one of the second output-side terminals 53. The wires 64 are components of the second output-side circuit described above. As shown in FIG. 2, each wire 64 is bonded to one electrode of the third semiconductor element 13 and also to the pad segment 532 of one second output-side terminal 53. The wires 64 include a wire 64a.

The wire 64a is bonded to one electrode of the third semiconductor element 13 and also to the pad segment 532 of the second output-side terminal 53a. Since the pad segment 532 of the second output-side terminal 53a is connected to the third die pad 4b, the second output-side terminal 53a supports the third die pad 4b. The wire 64a is an example of a "supporting-terminal wire". The wires 64 other than the wire 64a are examples of a "discrete-terminal wire".

As shown in FIG. 9, the wire 61c includes a wire segment 6a, a second bond 6b and a security bond 6c. The wire 61c also includes a first bond, which is not shown in the figure. The first bond is a portion of the wire attached to one electrode of the circuit part 111 of the first semiconductor element 11. The second bond 6b (so-called "crescent") is a portion attached to the pad segment 512 of the input-side terminal 51d (a pressed residue). The wire segment 6a is a main portion (a line portion) connected to the first bond and to the second bond 6b. The security bond 6c is formed on the second bond 6b to protect the second bond 6b and has a circular shape as viewed in the z direction. The pad segment 512 of the input-side terminal 51d has a dent 6d in the surface to which the wire 61c is bonded (the surface on the z1 side in the z direction and hereinafter referred to as "bonding surface"). The dent 6d is a circular indentation as viewed in the z direction formed at the second bonding for making the wire 61c.

In this embodiment, the security bond 6c has the center point C on the opposite side of the wire segment 6a with respect to the second bond 6b as viewed in the z direction.

In other words, the bonding surface includes a band-shaped region (diagonally shaded in FIG. 9) corresponding to an imaginary wire segment extending away from the wire segment 6a beyond the second bond 6b. The center point C is located inside this band-shaped region. In addition, the security bond 6c covers (contains) the entire boundary between the wire segment 6a the second bond 6b. In addition, the security bond 6c overlaps with the dent 6d as viewed in the z direction. In the illustrated example, a portion of the dent 6d is exposed from the security bond 6c. In this way, the security bond 6c appropriately covers and protects the second bond 6b and thus improves bond reliability of the wire 61c to the bonding surface. The wires 63a and 64a also have the similar configurations to the wire 61c.

With reference to FIG. 10, the wire 61a has a wire segment 6a and a second bond 6b. The wire 61a also includes a first bond, which is not shown in the figure. The first bond is a portion of the wire attached to one electrode of the circuit part 111 of the first semiconductor element 11. The second bond 6ba is a portion attached to the pad segment 512 of the input-side terminal 51a. As with the wire 61c described above, the second bond 6b has a crescent shape as viewed in the z direction. The wire segment 6a is a portion forming a wire loop between the first bond and the second bond 6b. The pad segment 512 of the input-side terminal 51a has a dent 6d in a surface to which the wire 61a is bonded (the surface on the z1 side in the z direction and hereinafter referred to as "bonding surface"). The dent 6d is a circular indentation as viewed in the z direction formed at the time of making the second bonding process of the wire 61a. The wire 61a is similar in configuration to the wire 61c except that the wire 61a is not provided with a security bond like the security bond 6c. The wires 61, 63 and 64 other than the wires 61c, 63a and 64a also have the similar configurations to the wire 61a described above.

As shown in FIG. 1, the sealing resin 7 covers the first semiconductor element 11, the second semiconductor element 12, the third semiconductor element 13, the first die pad 3, the second die pad 4a, the third die pad 4b, the wires 61 to 64, a portion of each input-side terminal 51, a portion of each first output-side terminal 52 and a portion of each second output-side terminal 53. The sealing resin 7 is electrically insulative. The sealing resin 7 may be made of a material containing a black epoxy resin, for example. As viewed in the z direction, the sealing resin 7 has a rectangular shape elongated in the y direction.

As shown in FIGS. 3 to 6, the sealing resin 7 has a top face 71, a bottom face 72, a first side face 73, a second side face 74, a third side face 75 and a fourth side face 76.

The top face 71 and the bottom face 72 are spaced apart from each other in the z direction. The top face 71 and the bottom face 72 face away from each other in the z direction. The top face 71 is located on the z1 in the z direction, and the bottom face 72 is located on the z2 side in the z direction. Each of the top face 71 and the bottom face 72 is substantially flat.

Each of the first side face 73, the second side face 74, the third side face 75 and the fourth side face 76 is connected to the top face 71 and the bottom face 72 and located between the top face 71 and the bottom face 72 in the z direction. The first side face 73 and the second side face 74 are spaced apart from each other in the x direction. The first side face 73 and the second side face 74 face away from each other in the x direction. The first side face 73 is located on the x1 side in the x direction, and the second side face 74 is located on the x2 in the x direction. The third side face 75 and the fourth side face 76 are spaced apart from each other in the y direction and each connected to the first side face 73 and the second side face 74. The third side face 75 and the fourth side face 76 face away from each other in the y direction. The third side face 75 is located on the y1 side in the y direction, and the fourth side face 76 is located on the y2 side in the y direction.

As shown in FIG. 1, a portion of each input-side terminal 51 protrudes from the first side face 73. Also, a portion of each first output-side terminal 52 and a portion of each second output-side terminal 53 protrude from the second side face 74. No portion of the conductive support member 2 is exposed on the third side face 75 and the fourth side face 76.

As shown in FIGS. 3 to 5, the first side face 73 includes a first reign 731, a second region 732 and a third region 733. The first reign 731 has one end in the z direction connected to the top face 71 and the other end to the third region 733. The first reign 731 is inclined relative to the top face 71. The second region 732 has one end in the z direction connected to the bottom face 72 and the other end to the third region 733. The second region 732 is inclined relative to the bottom face 72. The third region 733 has one end in the z direction connected to the first reign 731 and the other end to the second region 732. The third region 733 extends parallel to both the z direction and the y direction. As viewed in the z direction, the third region 733 is located outside relative to the top face 71 and the bottom face 72. A portion of each input-side terminal 51 is exposed on the third region 733.

As shown in FIGS. 3, 4 and 6, the second side face 74 includes a fourth region 741, a fifth region 742 and a sixth region 743. The fourth region 741 has one end in the z direction connected to the top face 71 and the other end to the sixth region 743. The fourth region 741 is inclined relative to the top face 71. The fifth region 742 has one end in the z direction connected to the bottom face 72 and the other end to the sixth region 743. The fifth region 742 is inclined relative to the bottom face 72. The sixth region 743 has one end in the z direction connected to the fourth region 741 and the other end to the fifth region 742. The sixth region 743 extends parallel to both the z direction and the y direction. As viewed in the z direction, the sixth region 743 is located outside relative to the top face 71 and the bottom face 72. A portion of each first output-side terminal 52 and a portion of each second output-side terminal 53 are exposed on the sixth region 743.

As shown in FIGS. 4 to 6, the third side face 75 includes a seventh region 751, an eighth region 752 and a ninth region 753. The seventh region 751 has one end in the z direction connected to the top face 71 and the other end to the ninth region 753. The seventh region 751 is inclined relative to the top face 71. The eighth region 752 has one end in the z direction connected to the bottom face 72 and the other end to the ninth region 753. The eighth region 752 is inclined relative to the bottom face 72. The ninth region 753 has one end in the z direction connected to the seventh region 751 and the other end to the eighth region 752. The ninth region 753 extends parallel to both the z direction and the x direction. As viewed in the z direction, the ninth region 753 is located outside relative to the top face 71 and the bottom face 72.

As shown in FIG. 4, the third side face 75 has a first gate mark 791. The first gate mark 791 has a greater surface roughness than the other regions of the third side face 75. The first gate mark 791 is formed during the manufacture of the semiconductor device A10 as described later, by removing resin burrs left at the side of a first gate 891 in the process of forming the sealing resin 7. As shown in FIG. 1, the first gate mark 791 is located on an extension lien L of the wire 61a as viewed in the z direction.

As shown in FIGS. 3, 5 and 6, the fourth side face 76 includes a tenth region 761, an eleventh region 762 and a twelfth region 763. The tenth region 761 has one end in the z direction connected to the top face 71 and the other end to the twelfth region 763. The tenth region 761 is inclined relative to the top face 71. The eleventh region 762 has one end in the z direction connected to the bottom face 72 and the other end to the twelfth region 763. The eleventh region 762 is inclined relative to the bottom face 72. The twelfth region 763 has one end in the z direction connected to the tenth region 761 and the other end to the eleventh region 762. The twelfth region 763 extends parallel to both the z direction and the x direction. As viewed in the z direction, the twelfth region 763 is located outside relative to the top face 71 and the bottom face 72.

As shown in FIG. 3, the fourth side face 76 has a second gate mark 792. The second gate mark 792 has a greater surface roughness than the other regions of the fourth side face 76. The second gate mark 792 is formed during the manufacture of the semiconductor device A10 as described later, by removing resin burrs left at the site of a second gate 892 in the process of forming the sealing resin 7. As shown in FIG. 1, the second gate mark 792 is located on the extension lien L of the wire 61a as viewed in the z direction.

Figure 11:
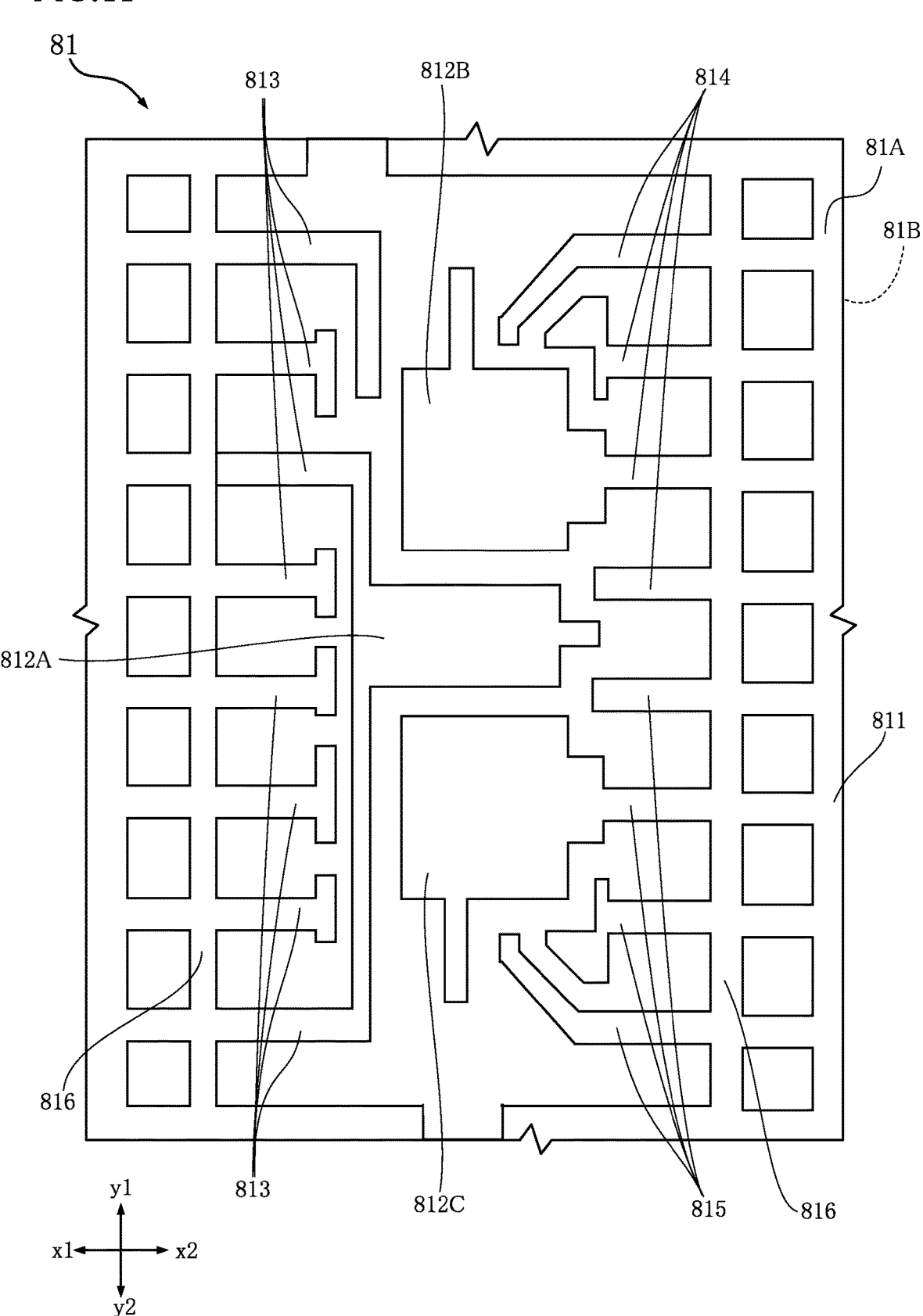
FIG. 11 is a plan view illustrating a process of a method for manufacturing the semiconductor device shown in FIG. 1.
Figure 12:
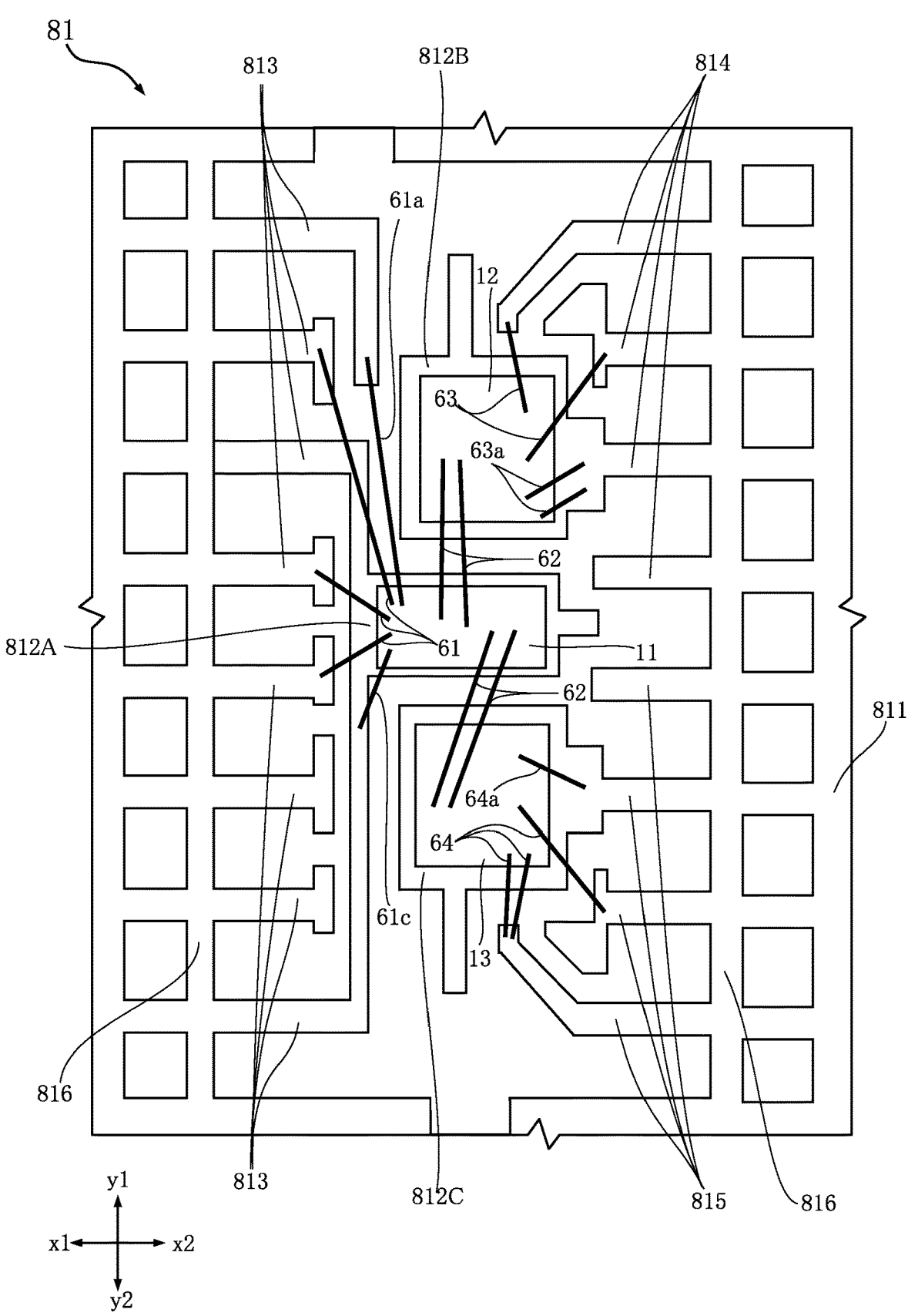
FIG. 12 is a plan view illustrating a process of the method for manufacturing the semiconductor device shown in FIG. 1.
Figure 13:
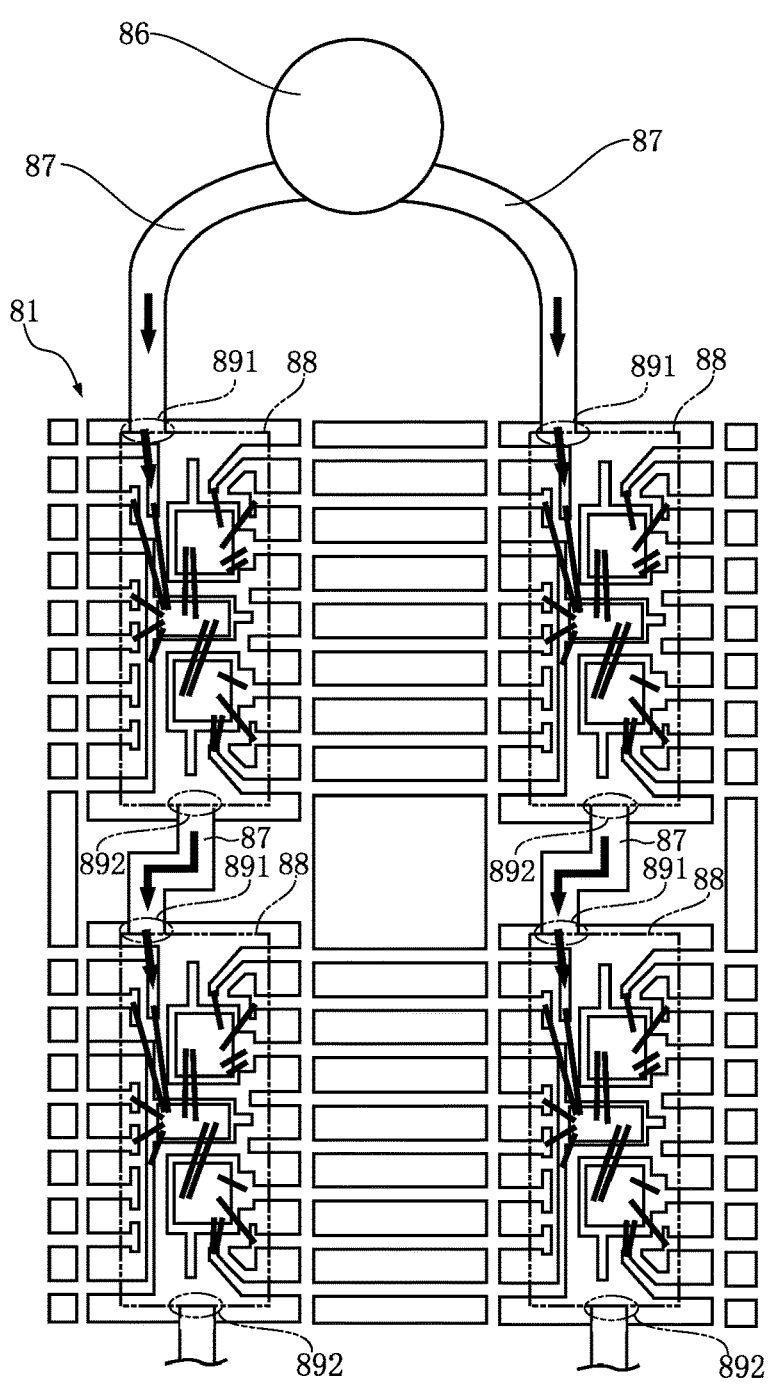
FIG. 13 is a plan view illustrating a process of the method for manufacturing the semiconductor device shown in FIG. 1.
Figure 13:
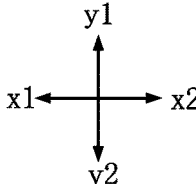

The following describes an example of a method for manufacturing the semiconductor device A10, with reference to FIGS. 11 to 13. FIGS. 11 to 13 are plan views each illustrating a process of the method for manufacturing the semiconductor device A10.

As shown in FIG. 11, a leadframe 81 is prepared. The leadframe 81 is essentially a plate. In this embodiment, the base material of leadframe 81 is Cu. The leadframe 81 may be from a metal plate by etching or stamping. The leadframe 81 has an obverse surface 81A and a reverse surface 81B spaced apart in the z direction. The leadframe 81 includes an outer frame 811, a first die pad 812A, a second die pad 812B, a third die pad 812C, a plurality of first leads 813, a plurality of second leads 814, a plurality of third leads 815 and a dam bar 816. The outer frame 811 and the dam bar 816 are not employed to form the semiconductor device A10. The first die pad 812A will form the first die pad 3. The second die pad 812B will form the second die pad 4a. The third die pad 812C will form the third die pad 4b. The first leads 813 will form the input-side terminals 51. The second leads 814 will form the first output-side terminals 52. The third leads 815 will form the second output-side terminals 53.

Next, as shown in FIG. 12, die bonding is performed to bond the first semiconductor element 11 to the first die pad 812A, the second semiconductor element 12 to the second die pad 812B, and the third semiconductor element 13 to the third die pad 812C. After these steps, wire bonding is performed to form a plurality of wires 61 to 64.

The wire 61a is formed by using a capillary, beginning with lowering the capillary toward the circuit part 111 of the first semiconductor element 11 to place the tip of a wire into contact with a target electrode. In this state, the wire tip is bonded to the electrode by the combined action of the weight of the capillary, ultrasonic vibrations generated by the capillary, and so on. Then, the capillary is raised while the wire is continually fed. This completes the first bond on the electrode. Next, the capillary is moved to a position directly above the portion of the first lead 813 where the pad segment 512 of the input-side terminal 51a will be formed. The capillary is then lowered to press the tip of the capillary against the bonding surface. As a result, the wire is sandwiched between the capillary tip and the bonding surface, and the wire portion pressed against the bonding surface forms a bond. At this time, the dent 6d is formed on the bonding surface. The capillary is then raised again to break the wire. This completes the second bond 6b on the bonding surface. The second bond 6b as viewed in the z direction has a crescent shape made by the imprint of the capillary tip pressing the wire. Through the above steps, the wire 61a is formed. The wires 61 other than the wire 61c are formed through similar steps.

The wire 61c is formed in the same manner as the process of forming the wire 61a until the second bond 6b is formed. That it, the process of forming the wire 61c further involves lowering the capillary toward the second bond 6b to press the wire tip against the second bond 6b and the bonding surface. In this state, the wire tip is bonded by the combined action of the weight of the capillary, ultrasonic vibrations generated by the capillary, and so on. Then, the capillary is raised again to break the wire. This completes the security bond 6c on the second bond 6b.

The process of forming each wire 62 involves making the first bond on an electrode of the insulating part 112 of the first semiconductor element 11, and the second bond 6b on an electrode of the second semiconductor element 12 or of the third semiconductor element 13. The process of forming each wire 63 involves making the first bond on an electrode of the second semiconductor element 12, and the second bond 6b on the portion of the second lead 814 where the pad segment 522 of a first output-side terminal 52 will be formed. The process of forming the wire 63a further involves making the security bond 6c on the second bond 6b. The process of forming each wire 64 involves making the first bond on an electrode of the third semiconductor element 13, and the second bond 6b on the portion of the third lead 815 where the pad segment 522 of a second output-side terminal 53 will be formed. The process of forming the wire 64a further involves making the security bond 6c on the second bond 6b.

Subsequently, a sealing resin 7 is formed. The sealing resin 7 is formed by transfer molding. As shown in FIG. 13, this process includes placing the leadframe 81 into a mold defining a plurality of cavities 88. The leadframe 81 is placed such that each portion of the conductive support member 2 to be covered later by the sealing resin 7 of a produced semiconductor device A10 is located within a corresponding one of the cavities 88. Then, melted resin is introduced from a pot 86, through runners 87, and into the cavities 88. The pot 86 is coupled to a plunger (not illustrated). By the action of the plunger, the resin melted within the pot 86 is forced to flow into the runners 87.

Each cavity 88 is provided with a first gate 891 and a second gate 892. The first gate 891 of each cavity 88 is an inlet for the melted resin. The first gate 891 is located on an extension line of the wire 61a as viewed in the z direction (see FIG. 12). The second gate 892 of each cavity 88 is an outlet for the melted resin. The second gate 892 is also located on the extension line of the wire 61a viewed in the z direction. With this arrangement, the melted resin within each cavity 88 tends to flow in the direction along the wire 61a but not in the direction crossing the wire 61a.

The melted resin injected into each cavity 88 is solidified to form the sealing resin 7, and resin burrs remaining outside the cavity 88 are removed by, for example, applying high-pressure water jet. Removing resin burrs from the site of the first gate 891 leaves the first gate mark 791 on the sealing resin 7. Similarly, removing resin burrs from the site of the second gate 892 leaves the second gate mark 792 on the sealing resin 7. The formation of the sealing resin 7 is completed through the above steps. In an alternative example, the second gate 892 may be used as an inlet of melted resin, and the first gate 891 as outlet.

Then, dicing is performed to separate individual chips, so that the first die pad 812A, the second die pad 812B, the third die pad 812C, the first leads 813, the second leads 814 and the third leads 815 are appropriately separated from the outer frame 811 and the dam bars 816. This completes the manufacture of the semiconductor device A10.

The following describes advantages of the semiconductor device A10.

According to the present embodiment, the first semiconductor element 11 includes the insulating part 112 that transmits signals between the circuit part 111 of the first semiconductor element 11 and the second semiconductor element 12 or the third semiconductor element 13, while electrically isolating the circuit part 111, the second semiconductor element 12 and the third semiconductor element 13. Although a significant potential difference may be caused between the circuit part 111 and the second semiconductor element 12 or the third semiconductor element 13, the present embodiment can increase the dielectric strength between the input-side circuit, which includes the circuit part 111 of the first semiconductor element 11, and the first and second output-side circuits, which respectively include the second semiconductor element 12 and the third semiconductor element 13.

According to the present embodiment, in addition, the conductive support member 2 includes the first die pad 3, the second die pad 4a, the third die pad 4b, the input-side terminals 51, the first output-side terminals 52 and the second output-side terminals 53. The input-side terminals 51 are exposed on the first side face 73, and the first output-side terminals 52 and the second output-side terminals 53 are exposed on the second side face 74. In contrast, no portion of the conductive support member 2 is exposed on the third side face 75 and the fourth side face 76. In other words, no metal part is exposed from the sealing resin 7 in a region where a significant potential difference is caused between the input-side terminals 51 and the first and second output-side terminals 52 and 53. This arrangement can thus increase the insulation distance between the input-side terminals 51 and the first and second output-side terminals 52 and 53 (the creepage distance along the surface of the sealing resin 7 between the exposed portions of the input-side terminals 51 and the exposed portions of the first and second output-side terminals 52 and 53). The semiconductor device A10 can therefore achieve a greater dielectric strength as compared with a configuration in which the conductive support member 2, such as a support lead, is exposed on the third side face 75 or the fourth side face 76. In addition, since there is no portion of the support lead exposed on the third side face 75, the design flexibility is increased in setting the location of the first gate 891, which is an inlet for melted resin for the process of forming the sealing resin 7. Similarly, since there is no portion of the support lead exposed on the fourth side face 76, the design flexibility is increased in in setting the location of the second gate 892, which is an outlet for melted resin for the process of forming the sealing resin 7.

In the semiconductor device A10, a transient voltage of 600 V or higher relative to the ground of the circuit part 111 of the first semiconductor element 11 may be applied to the second semiconductor element 12 or the third semiconductor element 13. In view of such a significant potential difference that can be caused between the second semiconductor element 12 or the third semiconductor element 13 and the circuit part 111 of the first semiconductor element 11, it is desirable to further increase the dielectric strength, in addition to the increase provided by the insulating part 112, for the reliability of the semiconductor device A10.

According to this embodiment, the first side face 73 of the sealing resin 7 has the first gate mark 791 having a greater surface roughness than the other regions of the first side face 73. The first gate mark 791 is formed as a result of the process of forming the sealing resin 7 (see FIG. 13) during the manufacture of the semiconductor device A10, at the site of the first gate 891 through which melted resin is injected into the cavity 88. As shown in FIG. 1, the first gate mark 791 is located on an extension lien L of the wire 61a as viewed in the z direction. This arrangement achieves an advantage in the process of forming the sealing resin 7 that the melted resin injected into the cavity 88 tends to flow in the direction along the wire 61a but not in the direction crossing the wire 61a. Such a resin flow can reduce the possibility of pushing the wire 61a closer toward the second semiconductor element 12 or the wire 61b.

According to this embodiment, the second side face 74 of the sealing resin 7 has the second gate mark 792 having a greater surface roughness than the other regions of the second side face 74. The second gate mark 792 is formed as a result of the process of forming the sealing resin 7 (see FIG. 13) during the manufacture of the semiconductor device A10, at the site of the second gate 892 through which melted resin is injected into the cavity 88. As shown in FIG. 1, the second gate mark 792 is located on the extension lien L of the wire 61a as viewed in the z direction. This arrangement achieves an advantage in the process of forming the sealing resin 7 that the melted injected into the cavity 88 tends to flow in the direction along the wire 61a but not in the direction crossing the wire 61a. Such a resin flow can reduce the possibility of pushing the wire 61a closer toward the second semiconductor element 12 or the wire 61b.

The wire 61a is connected to the circuit part 111 of the first semiconductor element 11, and thus a component of the input-side circuit, which is held at a relatively low potential. On the other hand, the second semiconductor element 12 is a component of the first output-side circuit, which is held at a relatively high potential. Keeping the wire 61a away from the second semiconductor element 12 helps to increase the dielectric strength of the semiconductor device A10.

According to the present embodiment, the wire 61c includes the security bond 6c protecting the second bond 6b that is bonded to the pad segment 512 of the input-side terminal 51d. The pad segment 512 of the input-side terminal 51d is connected to the first die pad 3 on which the first semiconductor element 11 is mounted. The linear expansion coefficient of the first semiconductor element 11 is different from that of the conductive support member 2. That is, the second bond 6b of the wire 61c is located near three different materials having different linear expansion coefficients (namely, the first semiconductor element 11, the conductive support member 2 and the sealing resin 7). Consequently, deterioration by heat cycling would be greater in the wire 61c than in the other wires 61, making a thinner portion more prone to cracking. The wire 61c, however, includes the security bond 6c on the second bond 6b and thus has a greater overall thickness, which serves to prevent cracking in the second bond 6b. In this way, the bond reliability of the wire 61c is improved. The bond reliability of the wire 61c is also improved because the security bond 6c as viewed in the z direction appropriately covers the portion (the thinner portion) of the security bond 6b more prone to cracking.

Each of the wires 63a and 64a is also provided with the security bond 6c that improves the bond reliability.

The first gate mark 791 and the second gate mark 792 in this embodiment are located on the extension line L of the wire 61a as viewed in the z direction, but the locations are not limited to such. For example, the first gate mark 791 and the second gate mark 792 may be located at the center in the x direction. In other words, the first gate 891 and the second gate 892 may be set at any appropriate locations for the process of forming the sealing resin 7 in the manufacture of the semiconductor device A10. In addition, without any portion of the support lead exposed on the third side face 75 and the fourth side face 76, the locations of the first gate 891 and the second gate 892 can be set with greater flexibility.

The conductive support member 2 of this embodiment is not exposed on the third side face 75 and the fourth side face 76, but the present disclosure is not limited to this configuration. For example, the support lead may have a portion exposed on the third side face 75 or fourth side face 76.

In addition, although this embodiment provides the security bond 6c only to the wires 61c, 63a and 64a, the present disclosure is not limited to this configuration. For example, all of the wires 61 to 64 may be provided with a security bond 6c or any of the wires 61 to 64 may be without the security bond 6c.

Figure 14:
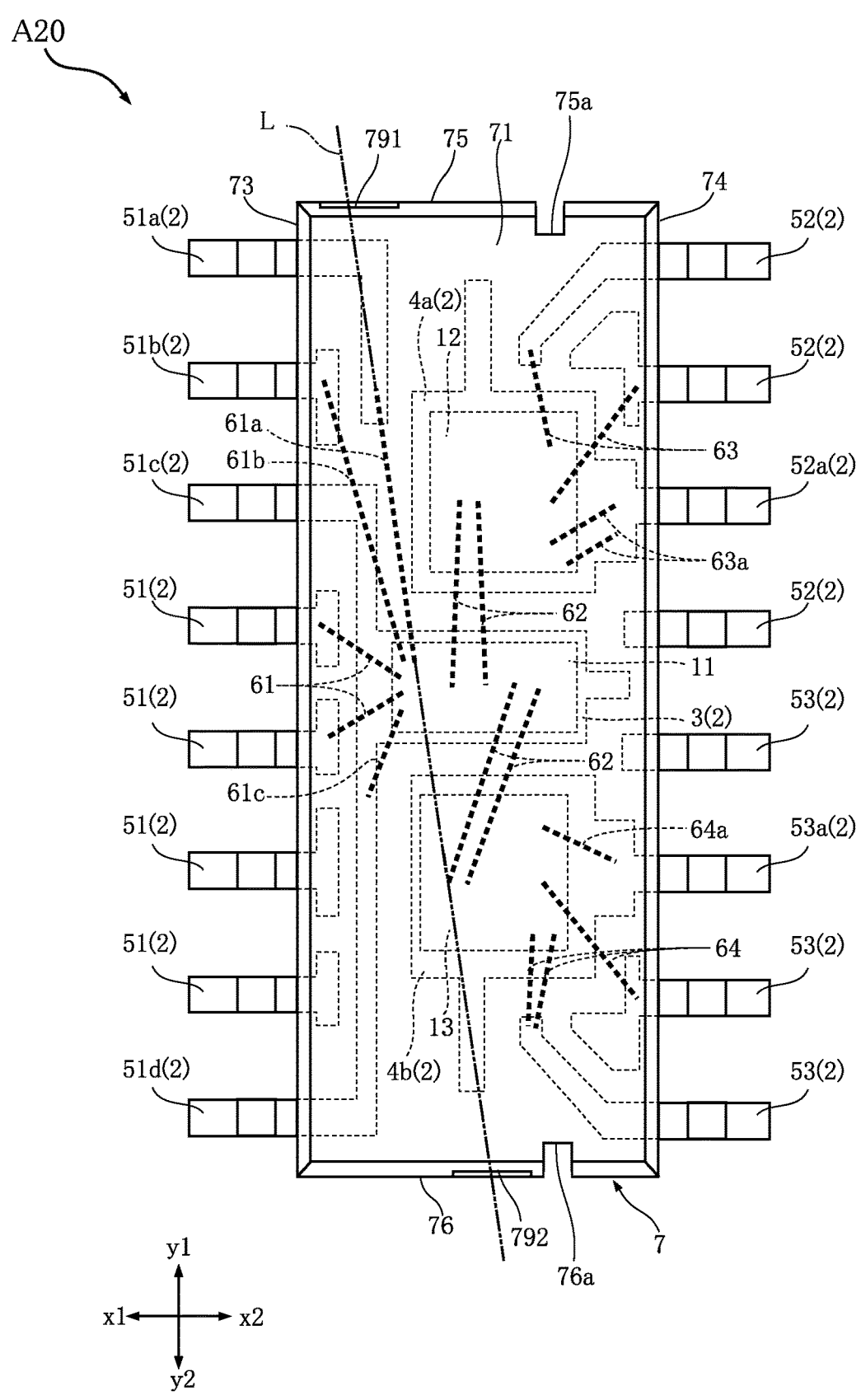
FIG. 14 is a plan view of a semiconductor device according to a second embodiment of the present disclosure.

FIG. 14 is a view of a semiconductor device A20 according to a second embodiment of the present disclosure. FIG. 14 is a plan view of the semiconductor device A20 and corresponds to FIG. 1. In FIG. 14, the elements that are identical or similar to those of the foregoing embodiment are denoted by the same reference signs. The semiconductor device A20 of this embodiment differs from that of the first embodiment in that the sealing resin 7 has grooves.

The sealing resin 7 of this this embodiment includes a groove 75a and a groove 76a. The groove 75a is recessed from the third side face 75 in the y direction and extends in the z direction. The groove 76a is recessed from the fourth side face 76 in the y direction and extends in the z direction.

The semiconductor device A20 of this embodiment includes the insulating part 112 in the first semiconductor element 11, which makes is possible to increase the dielectric strength between the input-side circuit and the first and second output-side circuits. In addition, without any portion the conductive support member 2 exposed on the third side face 75 and the fourth side face 76, the semiconductor device A20 of this embodiment can increase the insulation distance (creepage distance) between the input-side terminals 51 and the first and second output-side terminals 52 and 53. Consequently, the dielectric strength can be increased as compared with a configuration in which the conductive support member 2, such as a support lead, is exposed on the third side face 75 or the fourth side face 76. In addition, with the sealing resin 7 having the groove 75a on the third side face 75 and the groove 76a on the fourth side face 76, this embodiment can further increase the insulation distance between the input-side terminals 51 and the first and to second output-side terminals 52 and 53. This further increase the dielectric strength of the semiconductor device A20.

The semiconductor device according to the present disclosure is not limited to the foregoing embodiment. Various design changes may be made to the specific configuration of each part of the semiconductor device according to present disclosure.

Clause 1. A semiconductor device comprising:
a conductive support member including a first die pad and
  a second die pad spaced apart from the first die pad in a first sense of a first direction perpendicular to a thickness direction and held at a potential different from a potential of the first die pad;

a first semiconductor element mounted on the first die pad;

a second semiconductor element mounted on the second die pad and forming an output-side circuit together with the second die pad; and a sealing resin covering at least a portion of the conductive support member, the first semiconductor element and the second semiconductor element, wherein the first semiconductor element includes:

a circuit part forming an input-side circuit together with the first die pad; and an insulating part that transmits a signal between the input-side circuit and the output-side circuit and provides electrical insulation between the input-side circuit and the output-side circuit, the conductive support member includes:

a plurality of input-side terminals spaced apart from each other in the first direction, at least one of the plurality of input-side terminals being electrically connected to the input-side circuit; and a plurality of output-side terminals spaced apart from each other in the first direction, at least one of the plurality of output-side terminals being electrically connected to the output-side circuit, and the sealing resin includes: a first side face offset in a first sense of a second direction perpendicular to the thickness direction and the first direction, the plurality of input-side terminals protruding from the first side face; a second side face offset in a second sense of the second direction, the plurality of output-side terminals protruding from the second side face; a third side face offset in the first sense of the first direction and connected to the first side face and the second side face; and a fourth side face offset in a second sense of the first direction and connected to the first side face and the second side face, and the conductive support member is not exposed on the third side face.

Clause 2. The semiconductor device according to Clause 1, further comprising a third semiconductor element, wherein the conductive support member includes:

a third die pad spaced apart from the first die pad in the second sense of the first direction and held at a potential different from the first die pad; and a plurality of second output-side terminals spaced apart from each other in the first direction and protruding from the second side face, the third semiconductor element is mounted on the third die pad and forms a second output-side circuit together with the third die pad, the insulating part transmits a signal between the input-side circuit and the second output-side circuit and provides electrical insulation between the input-side circuit and the second output-side circuit, at least one of the plurality of second output-side terminals is electrically connected to the second output-side circuit, and the conductive support member is not exposed on the fourth side face.

Clause 3. The semiconductor device according to Clause 2, wherein the sealing resin further includes:

a first groove recessed from the third side face in the first direction and extending in the thickness direction, and a second groove recessed from the fourth side face in the first direction and extending in the thickness direction.

Clause 4. The semiconductor device according to any one of Clauses 1 to 3, wherein the third side face includes a first gate mark having a greater surface roughness than another region of the third side face, and the fourth side face includes a second gate mark having a greater surface roughness than another region of the fourth side face.

Clause 5. The semiconductor device according to Clause 4, further comprising a first wire, wherein the plurality of input-side terminals include an input-side first terminal that is an outermost one of the plurality of input-side terminals in the first sense of the first direction, the first wire is connected to the input-side first terminal and to the first semiconductor element, and the first gate mark is located on an extension line of the first wire as viewed in the thickness direction.

Clause 6. The semiconductor device according to Clause 5, further comprising a second wire, wherein the plurality of input-side terminals include an input-side second terminal adjacent to the input-side first terminal, the second wire is connected to the input-side second terminal and to the first semiconductor element, and the first wire is located between the second semiconductor element and the second wire as viewed in the thickness direction.

Clause 7. The semiconductor device according to Clause 5 or 6, wherein the second gate mark is located on the extension line as viewed in the thickness direction.

Clause 8. The semiconductor device according to Clause 2 or 3, further comprising a supporting-terminal wire, wherein the plurality of input-side terminals include a supporting terminal connected to the first die pad, and the supporting-terminal wire is connected to the supporting terminal and to the first semiconductor element, the supporting-terminal wire including a second bond that is a portion bonded to the supporting terminal and a security bond formed on the second bond.

Clause 9. The semiconductor device according to Clause 8, wherein the plurality of input-side terminals include a second supporting terminal connected to the first die pad, the supporting terminal is connected to an end of the first die pad offset in the second sense of the first direction, and the second supporting terminal is connected to an end of the first die pad offset in the first sense of the first direction.

Clause 10. The semiconductor device according to Clause 2 or 3, further comprising a supporting-terminal wire, wherein the plurality of output-side terminals include a supporting terminal connected to the second die pad, and the supporting-terminal wire is connected to the supporting terminal and to the second semiconductor element, the supporting-terminal wire including a second bond that is a portion bonded to the supporting terminal and a security bond formed on the second bond.

Clause 11. The semiconductor device according to Clause 2 or 3, further comprising a supporting-terminal wire, wherein the plurality of second output-side terminals include a supporting terminal connected to the third die pad, and the supporting-terminal wire is connected to the supporting terminal and to the third semiconductor element, the supporting-terminal wire including a second bond that is a portion bonded to the supporting terminal and a security bond formed on the second bond.

Clause 12. The semiconductor device according to any one of Clauses 8 to 11, wherein the supporting-terminal wire further includes a wire segment connected to the second bond, the supporting terminal includes a bonding surface to which the supporting-terminal wire is bonded, and
as viewed in the thickness direction, the security bond has a center located within a region of the bonding surface extending away from the wire segment beyond the second bond.

Clause 13. The semiconductor device according to Clause 12, wherein the second bond and the wire segment defines a boundary, as viewed in the thickness direction, that is contained within the security bond.

Clause 14. The semiconductor device according to Clause 12 or 13, wherein the supporting terminal includes a dent in the bonding surface, and
the security bond overlaps with the dent as viewed in the thickness direction.

Clause 15. The semiconductor device according to any one of Clauses 8 to 14, further comprising a discrete-terminal wire connected to a discrete terminal, the discrete terminal being one of the terminals of the conductive support member and not connected to any of the first die pad, the second die pad and the third die pad, wherein the discrete-terminal wire includes a discrete-terminal wire second bond that is a portion bonded to the discrete terminal, and
no security bond is formed on the discrete-terminal wire second bond.

Clause 16. The semiconductor device according to any one of Clauses 1 to 15, wherein the insulating part is of an inductive type.

Clause 17. The semiconductor device according to any one of Clauses 1 to 16, wherein the conductive support member is made of an alloy containing Cu.

Clause 18. The semiconductor device according to any one of Clauses 1 to 17, wherein the sealing resin is made of an electrically insulating epoxy resin.

REFERENCE NUMERALS

A10, A20: Semiconductor device 11: First semiconductor element
111: Circuit part 112: Insulating part
12: Second semiconductor element
13: Third semiconductor element
2: Conductive support member 3: First die pad
31: First obverse surface 32: First reverse surface
4a: Second die pad 4b: Third die pad
41: Second obverse surface 42: Second reverse surface
51, 51a, 51b, 51c, 51d: Input-side terminal
511: Lead segment 512: Pad segment
52, 52a: First output-side terminal 521: Lead segment
522: Pad segment 53, 53a: Second output-side terminal
531: Lead segment 532: Pad segment
61, 61a, 61b, 61c, 62, 63, 63a, 64, 64a: Wire
6a: Wire segment 6b: Second bond
6c: Security bond 6d: Dent
7: Sealing resin 71: Top face
72: Bottom face 73: First side face
731: First reign 732: Second reign
733: Third reign 74: Second side face
741: Fourth reign 742: Fifth reign
743: Sixth reign 75: Third side face
751: Seventh reign 752: Eighth reign
753: Ninth reign 75a: Groove
76: Fourth side face 761: Tenth reign -continued

REFERENCE NUMERALS

762: Eleventh reign 763: Twelfth region
76a: Groove 791: First gate mark
792: Second gate mark 81: Leadframe
81A: Obverse surface 81B: Reverse surface
811: Outer frame 812A: First die pad
812B: Second die pad 812C: Third die pad
813: First lead 814: Second lead
815: Third lead 816: Dam bar
86: Pot 87: Runner
88: Cavity 891: First gate
892: Second gate

The invention claimed is:

1. A semiconductor device comprising:
a conductive support member including a first die pad and a second die pad spaced apart from the first die pad in a first sense of a first direction perpendicular to a thickness direction and held at a potential different from a potential of the first die pad;
a first semiconductor element mounted on the first die pad;
a second semiconductor element mounted on the second die pad and forming an output-side circuit together with the second die pad;
a third semiconductor element; and
a sealing resin covering at least a portion of the conductive support member, the first semiconductor element and the second semiconductor element, wherein
the first semiconductor element includes:
a circuit part forming an input-side circuit together with the first die pad; and
an insulating part that transmits a signal between the input-side circuit and the output-side circuit and provides electrical insulation between the input-side circuit and the output-side circuit,
the conductive support member includes:
a plurality of input-side terminals spaced apart from each other in the first direction, at least one of the plurality of input-side terminals being electrically connected to the input-side circuit; and
a plurality of output-side terminals spaced apart from each other in the first direction, at least one of the plurality of output-side terminals being electrically connected to the output-side circuit, and
the sealing resin includes: a first side face offset in a first sense of a second direction perpendicular to the thickness direction and the first direction, the plurality of input-side terminals protruding from the first side face; a second side face offset in a second sense of the second direction, the plurality of output-side terminals protruding from the second side face; a third side face offset in the first sense of the first direction and connected to the first side face and the second side face; and a fourth side face offset in a second sense of the first direction and connected to the first side face and the second side face,
the conductive support member is not exposed on the third side face,
the conductive support member includes:
a third die pad spaced apart from the first die pad in the second sense of the first direction and held at a potential different from the first die pad; and
a plurality of second output-side terminals spaced apart from each other in the first direction and protruding from the second side face, the third semiconductor element is mounted on the third die pad and forms a second output-side circuit together with the third die pad, the insulating part transmits a signal between the input-side circuit and the second output-side circuit and provides electrical insulation between the input-side circuit and the second output-side circuit, at least one of the plurality of second output-side terminals is electrically connected to the second output-side circuit, and the conductive support member is not exposed on the fourth side face.

2. The semiconductor device according to claim 1, wherein the sealing resin further includes:

a first groove recessed from the third side face in the first direction and extending in the thickness direction, and a second groove recessed from the fourth side face in the first direction and extending in the thickness direction.

3. The semiconductor device according to claim 1, further comprising a supporting-terminal wire, wherein the plurality of input-side terminals include a supporting terminal connected to the first die pad, and the supporting-terminal wire is connected to the supporting terminal and to the first semiconductor element, the supporting-terminal wire including a second bond that is a portion bonded to the supporting terminal and a security bond formed on the second bond.

4. The semiconductor device according to claim 3, wherein the plurality of input-side terminals include a second supporting terminal connected to the first die pad, the supporting terminal is connected to an end of the first die pad offset in the second sense of the first direction, and the second supporting terminal is connected to an end of the first die pad offset in the first sense of the first direction.

5. The semiconductor device according to claim 3, wherein the supporting-terminal wire further includes a wire segment connected to the second bond, the supporting terminal includes a bonding surface to which the supporting-terminal wire is bonded, and as viewed in the thickness direction, the security bond has a center located within a region of the bonding surface extending away from the wire segment beyond the second bond.

6. The semiconductor device according to claim 5, wherein the second bond and the wire segment defines a boundary, as viewed in the thickness direction, that is contained within the security bond.

7. The semiconductor device according to claim 5, wherein the supporting terminal includes a dent in the bonding surface, and the security bond overlaps with the dent as viewed in the thickness direction.

8. The semiconductor device according to claim 3, further comprising a discrete-terminal wire connected to a discrete terminal, the discrete terminal being one of the terminals of the conductive support member and not connected to any of the first die pad, the second die pad and the third die pad, wherein the discrete-terminal wire includes a discrete-terminal wire second bond that is a portion bonded to the discrete terminal, and no security bond is formed on the discrete-terminal wire second bond.

9. The semiconductor device according to claim 1, further comprising a supporting-terminal wire, wherein the plurality of output-side terminals include a supporting terminal connected to the second die pad, and the supporting-terminal wire is connected to the supporting terminal and to the second semiconductor element, the supporting-terminal wire including a second bond that is a portion bonded to the supporting terminal and a security bond formed on the second bond.

10. The semiconductor device according to claim 1, further comprising a supporting-terminal wire, wherein the plurality of second output-side terminals include a supporting terminal connected to the third die pad, and the supporting-terminal wire is connected to the supporting terminal and to the third semiconductor element, the supporting-terminal wire including a second bond that is a portion bonded to the supporting terminal and a security bond formed on the second bond.

11. The semiconductor device according to claim 1, wherein the third side face includes a first gate mark having a greater surface roughness than another region of the third side face, and the fourth side face includes a second gate mark having a greater surface roughness than another region of the fourth side face.

12. The semiconductor device according to claim 11, further comprising a first wire, wherein the plurality of input-side terminals include an input-side first terminal that is an outermost one of the plurality of input-side terminals in the first sense of the first direction, the first wire is connected to the input-side first terminal and to the first semiconductor element, and the first gate mark is located on an extension line of the first wire as viewed in the thickness direction.

13. The semiconductor device according to claim 12, further comprising a second wire, wherein the plurality of input-side terminals include an input-side second terminal adjacent to the input-side first terminal, the second wire is connected to the input-side second terminal and to the first semiconductor element, and the first wire is located between the second semiconductor element and the second wire as viewed in the thickness direction.

14. The semiconductor device according to claim 12, wherein the second gate mark is located on the extension line as viewed in the thickness direction.

15. The semiconductor device according to claim 1, wherein the insulating part is of an inductive type.

16. The semiconductor device according to claim 1, wherein the conductive support member is made of an alloy containing Cu.

17. The semiconductor device according to claim 1, wherein the sealing resin is made of an electrically insulating epoxy resin.

* * * * *